(12) United States Patent
Inubushi et al.

(10) Patent No.: US 11,422,211 B2
(45) Date of Patent: *Aug. 23, 2022

(54) STACKED STRUCTURE, MAGNETORESISTIVE EFFECT ELEMENT, MAGNETIC HEAD, SENSOR, HIGH FREQUENCY FILTER, AND OSCILLATOR

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/148,686

(22) Filed: Jan. 14, 2021

(65) Prior Publication Data

US 2021/0165058 A1 Jun. 3, 2021

Related U.S. Application Data

(63) Continuation of application No. 16/138,031, filed on Sep. 21, 2018, now Pat. No. 10,921,392.

(30) Foreign Application Priority Data

Sep. 26, 2017 (JP) .............................. JP2017-184943

(51) Int. Cl.
*G01R 33/09* (2006.01)
*G11B 5/39* (2006.01)
(Continued)

(52) U.S. Cl.
CPC ......... *G01R 33/093* (2013.01); *G01R 33/098* (2013.01); *G01R 33/1284* (2013.01);
(Continued)

(58) Field of Classification Search
None
See application file for complete search history.

(56) References Cited

U.S. PATENT DOCUMENTS 5,939,202 A 8/1999 Ataka et al.
6,417,999 B1 7/2002 Knapp et al.
(Continued)

FOREIGN PATENT DOCUMENTS

JP H10-112017 A 4/1998
JP 2005-116703 A 4/2005
(Continued)

OTHER PUBLICATIONS

Goripati et al. "Bi-quadratic interlayer exchange coupling in Co2MnSi/Ag/Co2MnSi pseudo spin-valve." Journal of Applied Physics, vol. 110, 2011, p. 123914-1-123914-7.
(Continued)

*Primary Examiner* — Kevin M Bernatz
(74) *Attorney, Agent, or Firm* — Oliff PLC

(57) ABSTRACT

A stacked structure is positioned on a nonmagnetic metal layer. The stacked structure includes a ferromagnetic layer and an intermediate layer interposed between the nonmagnetic metal layer and the ferromagnetic layer. The intermediate layer includes a NiAlX alloy layer represented by Formula (1): $Ni_{\gamma 1}Al_{\gamma 2}X_{\gamma 3}$ ... (1), [X indicates one or more elements selected from the group consisting of Si, Sc, Ti, Cr, Mn, Fe, Co, Cu, Zr, Nb, and Ta, and satisfies an expression of $0<\gamma<0.5$ in a case of $\gamma=\gamma 3/(\gamma 1+\gamma 2+\gamma 3)$].

38 Claims, 21 Drawing Sheets

(51) Int. Cl.
*H01F 10/32* (2006.01)
*G11C 11/16* (2006.01)
*H01F 10/193* (2006.01)
*H01F 10/30* (2006.01)
*G01R 33/12* (2006.01)

(52) U.S. Cl.
CPC .......... *G11B 5/3909* (2013.01); *G11B 5/3929* (2013.01); *G11C 11/16* (2013.01); *G11C 11/161* (2013.01); *H01F 10/193* (2013.01); *H01F 10/30* (2013.01); *H01F 10/325* (2013.01); *H01F 10/3268* (2013.01); *H01F 10/3286* (2013.01); *G11B 2005/3996* (2013.01); *Y10T 428/115* (2015.01); *Y10T 428/1136* (2015.01)

(56) References Cited

U.S. PATENT DOCUMENTS

| | | | |
|---|---|---|---|
| 6,537,638 | B2 | 3/2003 | Do et al. |
| 6,689,496 | B1 | 2/2004 | Komura et al. |
| 10,366,714 | B1 | 7/2019 | Olson et al. |
| 10,921,392 | B2 * | 2/2021 | Inubushi ............... G11B 5/3909 |
| 11,335,365 | B2 * | 5/2022 | Inubushi ............... G01R 33/093 |
| 2003/0011944 | A1 * | 1/2003 | Hosomi ................. B82Y 25/00 365/158 |
| 2005/0073778 | A1 | 4/2005 | Hasegawa et al. |
| 2006/0083951 | A1 | 4/2006 | Arai et al. |
| 2010/0188771 | A1 | 7/2010 | Okamura et al. |
| 2012/0133008 | A1 | 5/2012 | Yamada et al. |
| 2016/0019917 | A1 | 1/2016 | Du et al. |
| 2017/0148474 | A1 | 5/2017 | Okamura et al. |
| 2018/0254409 | A1 | 9/2018 | Nakada et al. |
| 2018/0342668 | A1 | 11/2018 | Inubushi et al. |
| 2019/0173000 | A1 | 6/2019 | Inubushi et al. |
| 2019/0273203 | A1 | 9/2019 | Inubushi et al. |
| 2019/0279666 | A1 | 9/2019 | Freitag et al. |
| 2019/0279667 | A1 | 9/2019 | Freitag et al. |
| 2020/0044144 | A1 | 2/2020 | Sukegawa et al. |
| 2020/0303634 | A1 | 9/2020 | Inubushi et al. |

FOREIGN PATENT DOCUMENTS

| | | |
|---|---|---|
| JP | 2012-190914 A | 10/2012 |
| JP | 5416781 B2 | 2/2014 |
| JP | 6137577 B2 | 5/2017 |

OTHER PUBLICATIONS

Furubayashi et al. "Structure and transport properties of current-perpendicular-to-plane spin valves using Co2FeAl0.5Si0.5 and Co2MnSi Heusler alloy electrodes." Journal of Applied Physics, vol. 107, 2010, p. 113917-1-113917-7.

Smith et al. "Measurement of Gilbert damping parameters in nanoscale CPP-GMR spin valves." Physical Review, B81, May 25, 2010, p. 184431-1-184431-11.

* cited by examiner

Fig.3

| | 0 | 0.1 | 0.2 | 0.3 | 0.4 | 0.5 | 0.6 |
|---|---|---|---|---|---|---|---|
| NiAlSi | 0.53 | 0.35 | 0.32 | 0.3 | 0.39 | 0.41 | 0.48 |
| ScNiAl | 0.6 | 0.47 | 0.45 | 0.45 | 0.48 | 0.5 | 0.63 |
| NiAlTi | 0.49 | 0.38 | 0.37 | 0.38 | 0.4 | 0.41 | 0.45 |
| NiAlCr | 0.5 | 0.35 | 0.3 | 0.3 | 0.37 | 0.4 | 0.55 |
| MnNiAl | 0.6 | 0.45 | 0.4 | 0.4 | 0.48 | 0.5 | 0.65 |
| NiAlFe | 0.53 | 0.39 | 0.36 | 0.35 | 0.4 | 0.43 | 0.45 |
| CoNiAl | 0.5 | 0.36 | 0.32 | 0.33 | 0.37 | 0.39 | 0.53 |
| NiAlCu | 0.6 | 0.45 | 0.41 | 0.42 | 0.47 | 0.49 | 0.54 |
| NiAlZr | 0.5 | 0.37 | 0.31 | 0.32 | 0.38 | 0.4 | 0.53 |
| NiAlNb | 0.58 | 0.46 | 0.45 | 0.44 | 0.48 | 0.51 | 0.63 |
| NiAlTa | 0.53 | 0.43 | 0.41 | 0.41 | 0.46 | 0.47 | 0.55 |

Fig.4

| | α+β | α | β | FERROMAGNETIC LAYER | THICKNESS (nm) OF FERROMAGNETIC LAYER | INTERMEDIATE LAYER | THICKNESS t1 (nm) OF INTERMEDIATE LAYER | NONMAGNETIC METAL LAYER | THICKNESS (nm) OF NONMAGNETIC METAL LAYER | THICKNESS t2 (nm) OF DEAD LAYER |
|---|---|---|---|---|---|---|---|---|---|---|
| COMPARATIVE EXAMPLE 1 | – | – | – | Co2TiSn | 5 | NONE | | Cu | 50 | 1.2 |
| EXAMPLE 1 | – | – | – | Co2TiSn | 5 | NbNi2Al | 50 | Cu | 50 | 1.05 |
| EXAMPLE 2 | 2.25 | 1.3 | 0.95 | Co2Mn1.3Si0.95 | 5 | NbNi2Al | 50 | Cu | 50 | 1.05 |
| EXAMPLE 3 | 2.25 | 1.3 | 0.95 | Co2Mn1.3Si0.95 | 5 | NbNi2Al | 50 | Ag | 50 | 0.5 |
| EXAMPLE 4 | 2.25 | 1.3 | 0.95 | Co2Mn1.3Si0.95 | 5 | Cr0.66Ni0.67Al0.67 | 50 | Ag | 50 | 0.45 |
| EXAMPLE 5 | 2.25 | 1.3 | 0.95 | Co2Mn1.3Si0.95 | 5 | CrNi2Al | 50 | Ag | 50 | 0.4 |

Fig.5

EXAMPLE A GROUP

FERROMAGNETIC LAYER: $Co_2Mn_{1.3}Si_{0.95}$ /
INTERMEDIATE LAYER: $CrNi_2Al$ /
NONMAGNETIC METAL LAYER: Ag

| THICKNESS t1 (nm) OF INTERMEDIATE LAYER | THICKNESS t2 (nm) OF DEAD LAYER |
|---|---|
| 0.1 | 0.7 |
| 0.2 | 0.35 |
| 0.5 | 0.3 |
| 1 | 0.25 |
| 3 | 0.2 |
| 5 | 0.25 |
| 8 | 0.25 |
| 10 | 0.3 |
| 25 | 0.38 |
| 50 | 0.4 |

*Fig.7*

EXAMPLE B GROUP
(FERROMAGNETIC LAYER: $Co_2Mn_\alpha Si_{0.95}$/
INTERMEDIATE LAYER: $CrNi_2Al$/
NONMAGNETIC METAL LAYER: Ag)

| $\alpha + \beta$ | $\alpha$ | $\beta$ | MR RATIO (%) |
|---|---|---|---|
| 1.45 | 0.5 | 0.95 | |
| 1.55 | 0.6 | 0.95 | |
| 1.65 | 0.7 | 0.95 | |
| 1.75 | 0.8 | 0.95 | 1.1 |
| 1.85 | 0.9 | 0.95 | 1.3 |
| 1.95 | 1 | 0.95 | 10.1 |
| 2.05 | 1.1 | 0.95 | 15 |
| 2.15 | 1.2 | 0.95 | 16.1 |
| 2.25 | 1.3 | 0.95 | 17.5 |
| 2.35 | 1.4 | 0.95 | 17.7 |
| 2.45 | 1.5 | 0.95 | 18.3 |
| 2.55 | 1.6 | 0.95 | 17.9 |
| 2.65 | 1.7 | 0.95 | 6.6 |
| 2.75 | 1.8 | 0.95 | |

*Fig.8*

EXAMPLE C GROUP
(FERROMAGNETIC LAYER: $Co_2Mn_{1.3}Si_\beta$/
INTERMEDIATE LAYER: $CrNi_2Al$/
NONMAGNETIC METAL LAYER: Ag)

| $\alpha+\beta$ | $\alpha$ | $\beta$ | MR RATIO (%) |
|---|---|---|---|
| 1.85 | 1.3 | 0.55 | 4.9 |
| 1.95 | 1.3 | 0.65 | 6.9 |
| 2.05 | 1.3 | 0.75 | 12.4 |
| 2.15 | 1.3 | 0.85 | 14.2 |
| 2.25 | 1.3 | 0.95 | 15.8 |
| 2.35 | 1.3 | 1.05 | 16.3 |
| 2.45 | 1.3 | 1.15 | 17.2 |
| 2.55 | 1.3 | 1.25 | 18 |
| 2.65 | 1.3 | 1.35 | 8.8 |
| 2.75 | 1.3 | 1.45 | 7.6 |

Fig.10

| | a | 2a | a×√2 | STRUCTURE TYPE | Pearson Symbol |
|---|---|---|---|---|---|
| Ag | 0.41 | — | 0.579828(*) | Cu | cF4 |
| NiAlSi | 0.5511(*) | — | — | CaF2 | cF12 |
| NiAl$_{0.75}$Si$_{0.25}$ | 0.2841 | 0.5682(*) | — | CsCl | cP2 |
| ScNi2Al | 0.5990(*) | — | — | Cu2MnAl | cF16 |
| TiNi2Al | 0.5865(*) | — | — | Cu2MnAl | cF16 |
| TiNi$_{0.25}$Al$_{2.75}$ | 0.3930 | — | 0.5558(*) | Cu3Au | cP4 |
| CrNi2Al | 0.5737(*) | — | — | Cu2MnAl | cF16 |
| Cr$_{0.66}$Ni$_{0.67}$Al$_{0.67}$ | 0.2870 | 0.5740(*) | — | CsCl | cP2 |
| MnNi2Al | 0.5824(*) | — | — | Cu2MnAl | cF16 |

VALUE WITH (*) MARK IS USED FOR CALCULATING LATTICE CONSTANT DIFFERENCE

*Fig.11*

| | a | 2a | a×√2 | STRUCTURE TYPE | Pearson Symbol |
|---|---|---|---|---|---|
| Ag | 0.41 | | 0.579828(*) | Cu | cF4 |
| $Mn_{0.5}Ni_{0.5}Al$ | 0.2930 | 0.5860(*) | — | CsCl | cP2 |
| $Fe_2NiAl$ | 0.5758(*) | — | — | $Cu_2MnAl$ | cF16 |
| $Co_{0.5}Ni_{0.5}Al$ | 0.2866 | 0.5732(*) | — | CsCl | cP2 |
| $Cu_{0.4}Ni_{0.6}Al$ | 0.2908 | 0.5816(*) | — | CsCl | cP2 |
| $ZrNi_2Al$ | 0.6100(*) | — | — | $Cu_2MnAl$ | cF16 |
| $ZrNi_{0.48}Al_{2.52}$ | 0.4060 | — | 0.5742(*) | $Cu_3Au$ | cP4 |
| $NbNi_2Al$ | 0.5969(*) | — | — | $Cu_2MnAl$ | cF16 |
| $TaNi_2Al$ | 0.5904(*) | — | — | $Cu_2MnAl$ | cF16 |

VALUE WITH (*) MARK IS USED FOR CALCULATING LATTICE CONSTANT DIFFERENCE

Fig.12

| | Co2MnSi | Co2MnGe | Co2MnGa | Co2FeGa | Co2FeSi | Co2MnSn | Co2MnAl | Co2FeAl |
|---|---|---|---|---|---|---|---|---|
| a | 0.5606 | 0.5711 | 0.577 | 0.5677 | 0.5658 | 0.5982 | 0.5664 | 0.573 |

| | Co2CrAl | Co2VAl | Co2MnGa0.5Sn0.5 | Co2FeGeGa |
|---|---|---|---|---|
| a | 0.589 | 0.58 | 0.587 | 0.574 |

Fig.13

| | Co2MnSi | Co2MnGe | Co2MnGa | Co2FeGa | Co2FeSi | Co2MnSn | Co2MnAl | Co2FeAl |
|---|---|---|---|---|---|---|---|---|
| Ag | 3.43% | 1.53% | 0.49% | 2.14% | 2.48% | -3.07% | 2.37% | 1.19% |
| NiAlSi | -1.69% | -3.50% | -4.49% | -2.92% | -2.60% | -7.87% | -2.70% | -3.82% |
| NiAl$_{0.75}$Si$_{0.25}$ | 1.36% | -0.51% | -1.53% | 0.09% | 0.42% | -5.02% | 0.32% | -0.84% |
| ScNi2Al | 6.85% | 4.89% | 3.81% | 5.51% | 5.87% | 0.13% | 5.76% | 4.54% |
| TiNi2Al | 4.62% | 2.70% | 1.65% | 3.31% | 3.66% | -1.96% | 3.55% | 2.36% |
| TiNi$_{0.25}$Al$_{2.75}$ | -0.86% | -2.68% | -3.68% | -2.10% | -1.77% | -7.09% | -1.87% | -3.00% |
| CrNi2Al | 2.34% | 0.46% | -0.57% | 1.06% | 1.40% | -4.10% | 1.29% | 0.12% |
| Cr$_{0.66}$Ni$_{0.67}$Al$_{0.67}$ | 2.39% | 0.51% | -0.52% | 1.11% | 1.45% | -4.05% | 1.34% | 0.17% |
| MnNi2Al | 3.89% | 1.98% | -0.94% | 2.59% | 2.93% | -2.64% | 2.82% | 1.64% |

Fig. 14

| | Co2CrAl | Co2VAl | Co2MnGa0.5Sn0.5 | Co2FeGeGa |
|---|---|---|---|---|
| Ag | -1.56% | -0.03% | -1.22% | 1.02% |
| NiAlSi | -6.43% | -4.98% | -6.12% | -3.99% |
| NiAl0.75Si0.25 | -3.53% | -2.03% | -3.20% | -1.01% |
| ScNi2Al | 1.70% | 3.28% | 2.04% | 4.36% |
| TiNi2Al | -0.42% | 1.12% | -0.09% | 2.18% |
| TiNi0.25Al2.75 | -5.64% | -4.17% | -5.32% | -3.17% |
| CrNi2Al | 2.60% | -1.09% | -2.27% | -0.05% |
| Cr0.66Ni0.67Al0.67 | -2.55% | -1.03% | -2.21% | 0.00% |
| MnNi2Al | -1.12% | 0.41% | -0.78% | 1.46% |

Fig.15

|  | Co2MnSi | Co2MnGe | Co2MnGa | Co2FeGa | Co2FeSi | Co2MnSn | Co2MnAl | Co2FeAl |
|---|---|---|---|---|---|---|---|---|
| Ag | 3.43% | 1.53% | 0.49% | 2.14% | 2.48% | -3.07% | 2.37% | 1.19% |
| Mn0.5Ni0.5Al | 4.53% | 2.61% | 1.56% | 3.22% | 3.57% | -2.04% | 3.46% | 2.27% |
| Fe2NiAl | 2.71% | 0.82% | -0.21% | 1.43% | 1.77% | -3.74% | 1.66% | 0.49% |
| Co0.5Ni0.5Al | 2.25% | 0.37% | -0.66% | 0.97% | 1.31% | -4.18% | 1.20% | 0.03% |
| Cu0.4Ni0.6Al | 3.75% | 1.84% | 0.80% | 2.45% | 2.79% | -2.77% | 2.68% | 1.50% |
| ZrNi2Al | 8.81% | 6.81% | 5.72% | 7.45% | 7.81% | 1.97% | 7.70% | 6.46% |
| ZrNi0.48Al2.52 | 2.42% | 0.54% | -0.49% | 1.14% | 1.48% | -4.02% | 1.37% | 0.20% |
| NbNi2Al | 6.48% | 4.52% | 3.45% | 5.14% | 5.50% | -0.22% | 5.38% | 4.17% |
| TaNi2Al | 5.32% | 3.38% | 2.32% | 4.00% | 4.35% | -1.30% | 4.24% | 3.04% |

Fig. 16

|  | Co2CrAl | Co2VAl | Co2MnGa0.5Sn0.5 | Co2FeGeGa |
|---|---|---|---|---|
| Ag | -1.56% | -0.03% | -1.22% | 1.02% |
| Mn0.5Ni0.5Al | -0.51% | 1.03% | -0.17% | 2.09% |
| Fe2NiAl | -2.24% | -0.72% | -1.91% | 0.31% |
| Co0.5Ni0.5Al | -2.68% | -1.17% | -2.35% | -0.14% |
| Cu0.4Ni0.6Al | -1.26% | 0.28% | -0.92% | 1.32% |
| ZrNi2Al | 3.57% | 5.17% | 3.92% | 6.27% |
| ZrNi0.48Al2.52 | -2.52% | -1.01% | -2.19% | 0.03% |
| NbNi2Al | 1.34% | 2.91% | 1.69% | 3.99% |
| TaNi2Al | 0.24% | 1.79% | 0.58% | 2.86% |

Fig.21

| | MATERIAL | LATTICE CONSTANT (nm) | FILM THICKNESS (nm) | EXAMPLE 6 MR RATIO (%) |
|---|---|---|---|---|
| SECOND FERROMAGNETIC LAYER 6 | Co$_2$Mn$_{1.0}$Si$_{0.95}$ | 0.5606 | 5 | |
| SECOND INTERMEDIATE LAYER 5C | CrNi$_2$Al | 0.5737 | 0.5 | |
| NONMAGNETIC METAL LAYER 5B | NiAl | 0.5760 | 0.5 | 12.3 |
| | Ag | 0.5798 | 5 | |
| FIRST INTERMEDIATE LAYER 5A | CrNi$_2$Al | 0.5737 | 0.5 | |
| | NiAl | 0.5760 | 0.5 | |
| FIRST FERROMAGNETIC LAYER 4 | Co$_2$Mn$_{1.0}$Si$_{0.95}$ | 0.5606 | 10 | |

STACKED STRUCTURE, MAGNETORESISTIVE EFFECT ELEMENT, MAGNETIC HEAD, SENSOR, HIGH FREQUENCY FILTER, AND OSCILLATOR

CROSS-REFERENCE TO RELATED APPLICATION

This application is a continuation of application Ser. No. 16/138,031, filed on Sep. 21, 2018 (now U.S. Pat. No. 10,921,392), which claims the benefit of priority from Japanese Patent Application No. 2017-184943, filed on Sep. 26, 2017, the entire contents of which are incorporated herein by reference.

TECHNICAL FIELD

The present disclosure relates to a stacked structure, a magnetoresistive effect element, a magnetic head, a sensor, a high frequency filter, and an oscillator.

BACKGROUND

Recently, a giant magnetoresistive effect element (GMR element) configured with a multilayer film of a ferromagnetic layer and a nonmagnetic metal layer and a tunnel magnetoresistive effect element (TMR element) configured with a ferromagnetic layer, an insulating layer, and a ferromagnetic layer attract attentions as basic functional elements of various devices. The TMR element is used for a magnetic tunnel junction element (MTJ element) and the like. The above element can also be applied to a new magnetic field sensor, a non-volatile magnetic random access memory (MRAM), and the like. The above element is also expected to be applied to a spin injection element and the like. The spin injection element is an element using a spin accumulation effect expected to have a high resolution and a high output, regarding a hard disk having surface recording density of a terabit class. In the TMR element disclosed in Patent Document 1, a MgO layer as a barrier layer is interposed between a nonmagnetic metal layer and a ferromagnetic layer. As disclosed in Non-Patent Document 1, in a GMR element in which a nonmagnetic metal layer is disposed between ferromagnetic layers, the nonmagnetic metal layer made using Cu is known.
Patent Document 1: Japanese Patent No. 5416781.
Non-Patent Document 1: PHYSICAL REVIEW B 81, 184431 (2010).

SUMMARY

In a case of the above-described structure, relatively high spin injection efficiency is provided. However, a structure allowing further improvement of the spin injection efficiency is expected. Considering such circumstances, an object of the present disclosure is to provide a stacked structure having improved spin injection efficiency in a case of being applied to a magnetoresistive effect element, a magnetoresistive effect element, a magnetic head, a sensor, a high frequency filter, and an oscillator.

The inventor of the present application has performed close examinations, and thus has found that a dead layer which does not magnetically act expanded and spin injection efficiency is not improved, in a case where a nonmagnetic metal layer and a ferromagnetic layer are directly stacked to each other. In addition, it has been found that it is possible to improve spin injection efficiency by using a NiAlX alloy layer (X indicates predetermined metal or semiconductor) between the nonmagnetic metal layer and the ferromagnetic layer. If the NiAlX alloy layer capable of alleviating lattice mismatch is used between the nonmagnetic metal layer and the ferromagnetic layer, crystal quality is improved, and the region of the dead layer which does not magnetically act is reduced. In a case of being applied to a magnetoresistive effect element, it is possible to improve spin injection efficiency.

To achieve the above-described object, a first stacked structure is a stacked structure positioned on a nonmagnetic metal layer. The first stacked structure includes a ferromagnetic layer and an intermediate layer interposed between the nonmagnetic metal layer and the ferromagnetic layer. The intermediate layer includes a NiAlX alloy layer represented by Formula (1).

$$Ni_{\gamma 1}Al_{\gamma 2}X_{\gamma 3} \quad (1)$$

[X indicates one or more elements selected from the group consisting of Si, Sc, Ti, Cr, Mn, Fe, Co, Cu, Zr, Nb, and Ta, and satisfies an expression of $0<\gamma<0.5$ in a case of $\gamma=\gamma 3/(\gamma 1+\gamma 2+\gamma 3)$]

The stacked structure contains NiAlX alloy represented by Formula (1) such that lattice mismatch between the ferromagnetic layer and the nonmagnetic metal layer occurs smaller than that in a case where the nonmagnetic metal layer is stacked with only the ferromagnetic layer. Therefore, according to the stacked structure, the dead layer in the ferromagnetic layer and the nonmagnetic metal layer is reduced.

In this case, since the intermediate layer is provided, lattice mismatch between the nonmagnetic metal layer and the ferromagnetic layer is alleviated, and crystallinity thereof is improved. Thus, the region of the dead layer is reduced. Accordingly, a region which acts magnetically expands, and thus it is possible to improve spin injection efficiency. In particular, in a case where $\gamma$ is within the above range, the region of the dead layer is particularly reduced.

In a second stacked structure, the value of $\gamma 3$ changes along an in-plane direction or a thickness direction. That is, the value of $\gamma 3$ is set and concentration of an X element is changed, in accordance with the degree of local lattice mismatch, such that the lattice mismatch is alleviated. Consequently, an effect of improving quality of the ferromagnetic layer and the nonmagnetic metal layer is expected.

In a third stacked structure, the ferromagnetic layer includes a Heusler alloy represented by Formula (2) in a case where L indicates one or more elements selected from the group consisting of Mn and Fe, M indicates one or more elements selected from the group consisting of Si, Al, Ga, and Ge, and $\alpha$ and $\beta$ are set to have positive values. In a case where the ferromagnetic layer is made of the Heusler alloy, spin polarizability is high, and spin injection efficiency is high.

$$Co_2L_\alpha M_\beta \quad (2)$$

In a case where L and M are the above elements, the Heusler alloy for the ferromagnetic layer has a lattice constant-corresponding reference value close to that of the NiAlX alloy layer represented by Formula (1). Even though the number of the above element is not one but one or more, it is easily estimated that the ferromagnetic layer has a lattice constant close to that of the NiAlX alloy layer. Thus, it is possible to hold crystallinity and magnetic quality of the ferromagnetic layer to be favorable. As a result, it is possible to more reduce the dead layer in the ferromagnetic layer and the nonmagnetic metal layer. Here, the lattice constant-corresponding reference value means any one value of a lattice constant a and a value of two times the lattice constant a when crystal planes thereof are aligned in a state of being inclined by 0 degrees. The lattice constant-corresponding reference value means a value obtained by multiplying a by the square root of 2 when the crystal planes of the layers are aligned in a state of being inclined by 45 degrees.

In a fourth stacked structure, the value of γ3 decreases as becoming farther from the ferromagnetic layer in the thickness direction thereof. In the stacked structure, the concentration of the X element on the ferromagnetic layer side in the NiAlX alloy layer represented by Formula (1) is higher than that in a case of only the ferromagnetic layer being stacked. Thus, lattice mismatch between the ferromagnetic layer and the nonmagnetic metal layer is more reduced. Since the concentration of the X element on the nonmagnetic metal layer side is low, lattice mismatch between the ferromagnetic layer and the nonmagnetic metal layer is more reduced. Therefore, according to the stacked structure, the region of the dead layer in the ferromagnetic layer and the nonmagnetic metal layer is more reduced.

In a fifth stacked structure, the nonmagnetic metal layer includes one or more elements selected from the group consisting of Ag, Cr, Al, Au, and NiAl. According to the nonmagnetic metal layer, it is possible to easily suppress an occurrence of a situation in which the X element is diffused into the nonmagnetic metal layer. It is not necessary that one element having a diffusion coefficient smaller than that of the X element is provided. It is considered that, if the number of such elements is equal to or greater than 1, a diffusion suppression effect is obtained.

In a sixth stacked structure, the X in the NiAlX alloy layer indicates one or more element selected from the group consisting of Si, Cr, Fe, Co, and Zr. In the stacked structure, a relationship as follows can be established: the lattice constant-corresponding reference value of the ferromagnetic layer the lattice constant-corresponding reference value of the NiAlX alloy layer the lattice constant-corresponding reference value of the nonmagnetic metal layer; or the lattice constant-corresponding reference value of the ferromagnetic layer the lattice constant-corresponding reference value of the NiAlX alloy layer the lattice constant-corresponding reference value of the nonmagnetic metal layer. Thus, the lattice mismatch between the ferromagnetic layer and the nonmagnetic metal layer is alleviated. Here, the lattice constant-corresponding reference value means any one value of a lattice constant a and a value of two times the lattice constant a when crystal planes thereof are aligned in a state of being inclined by 0 degrees. The lattice constant-corresponding reference value means a value obtained by multiplying a by the square root of 2 when the crystal planes of the layers are aligned in a state of being inclined by 45 degrees. Therefore, according to the stacked structure, the dead layer in the ferromagnetic layer and the nonmagnetic metal layer is reduced. The relationship between the lattice constant-corresponding reference values can be established even though the number of elements is equal to or greater than 1.

In a seventh stacked structure, in Formula (1), an expression of 0<γ<0.3 is satisfied. In a case where γ is within the above range, the region of the dead layer is more reduced. In the stacked structure, since the crystal structure of the NiAlX alloy layer is stable, it is possible to obtain a face-centered cubic lattice structure. As a result, it is possible to alleviate lattice mismatch between the ferromagnetic layer and the nonmagnetic metal layer and to reduce the region of the dead layer.

In an eighth stacked structure, when the thickness of the NiAlX alloy layer is set as t1, an expression of 0.2 nm≤t1≤10 nm is satisfied. According to the stacked structure, at the time of t1≤10 nm, in electrons which move from the ferromagnetic layer or to the ferromagnetic layer, an occurrence of spin scattering is more reduced. At the time of 0.2 nm≤t1, the lattice mismatch between the ferromagnetic layer and the nonmagnetic metal layer is more reduced. As a result, the dead layer in the ferromagnetic layer and the nonmagnetic metal layer is reduced.

In a ninth stacked structure, in the Heusler alloy represented by Formula (2), α and β satisfy the following relational expressions (2-1), (2-2), and (2-3).

$$0.7<\alpha<1.6 \qquad (2\text{-}1)$$

$$0.65<\beta<1.35 \qquad (2\text{-}2)$$

$$2<\alpha+\beta<2.6 \qquad (2\text{-}3)$$

According to the stacked structure, the expressions of $0.7<\alpha<1.6$ and $0.65<\beta<1.35$ are satisfied. Thus, the Heusler alloy for the ferromagnetic layer has a lattice constant close to that in a case of having a stoichiometric composition and a favorable lattice matching property is obtained. Since the expression of $2<\alpha+\beta<2.6$ is satisfied, the Heusler alloy for the ferromagnetic layer easily holds the half-metal characteristics, and thus it is possible to obtain a large magnetoresistive effect (MR ratio).

According to the present disclosure, a magnetoresistive effect element includes any of the above-described structural bodies. According to the present disclosure, each of a magnetic head, a sensor, a high frequency filter, and an oscillator includes the above-described magnetoresistive effect element.

If the stacked structure can utilize electron spins, the region of the dead layer is reduced. Thus, the stacked structure can also be applied for the usage other than the magnetoresistive effect element (techniques using the spin Hall effect or the inverse spin Hall effect and using a spin transfer torque).

According to the present disclosure, it is possible to provide a stacked structure, a magnetoresistive effect element, a magnetic head, a sensor, a high frequency filter, and an oscillator in which it is possible to improve spin injection efficiency.

BRIEF DESCRIPTION OF THE DRAWINGS

FIG. 3 is a table illustrating a relationship between γ and a dead layer in an intermediate layer made of a NiAlX alloy.

FIG. 4 is a table illustrating the thickness and the like of the dead layer in a magnetoresistive effect element (comparative example, Examples 1 to 5).

FIG. 5 is a table illustrating a relationship between a thickness t1 (nm) of the intermediate layer and a thickness t2 (nm) of the dead layer in an Example A group.

FIG. 7 is a table illustrating a relationship (β is constant) between various parameters (α+β, α, and β) and an MR ratio (%) in a ferromagnetic layer ($Co_2L_\alpha M_\beta$) in an Example B group.

FIG. 8 is a table illustrating a relationship (a is constant) between various parameters (α+β, α, and β) and an MR ratio (%) in a ferromagnetic layer ($Co_2L_\alpha M_\beta$) in an Example C group.

FIG. 10 is a table illustrating lattice constants, structure types, and Pearson symbols of Ag and NiAlX alloy.

FIG. 11 is a table illustrating the lattice constants, the structure types, and the Pearson symbols of Ag and NiAlX alloy.

FIG. 12 is a table illustrating lattice constants of various Heusler alloys.

FIG. 13 is a table illustrating lattice mismatch ratios between Ag or NiAlX alloy, and the various Heusler alloys.

FIG. 14 is a table illustrating the lattice mismatch ratios between Ag or NiAlX alloy, and the various Heusler alloys.

FIG. 15 is a table illustrating the lattice mismatch ratios between Ag or NiAlX alloy, and the various Heusler alloys.

FIG. 16 is a table illustrating the lattice mismatch ratios between Ag or NiAlX alloy, and the various Heusler alloys.

FIG. 21 is a table illustrating a material, a lattice constant, a film thickness, and an MR ratio (%) in a case where the magnetoresistive effect element in FIG. 1 is modified.

DETAILED DESCRIPTION

Hereinafter, magnetoresistive effect elements according to embodiments will be described. The same components are denoted by the same reference signs and descriptions thereof will not be repeated. In a case using a three-dimensional orthogonal coordinate system, a thickness direction of each layer is set as a Z-axis direction, and two orthogonal axes which are vertical to a Z axis are set to be an X axis and a Y axis, respectively.

Figure 1:
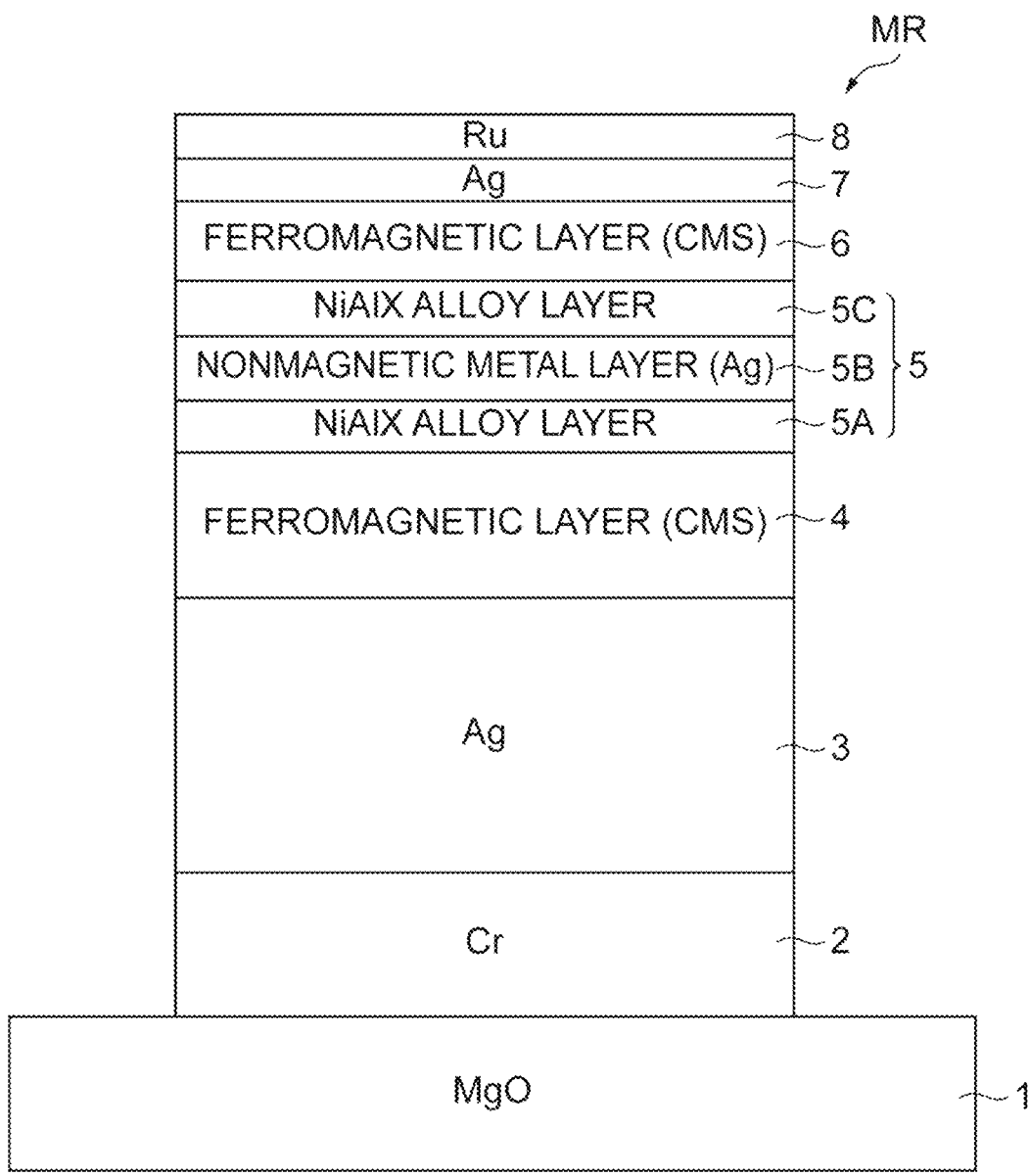
FIG. 1 is a front view illustrating a magnetoresistive effect element MR according to an example.

FIG. 1 is a front view illustrating a magnetoresistive effect element MR according to an example.

In the magnetoresistive effect element MR, a first nonmagnetic metal layer 2 and a second nonmagnetic metal layer 3 are sequentially provided on a substrate 1. In the magnetoresistive effect element, a first ferromagnetic layer 4 as a fixed magnetization layer, a nonmagnetic spacer layer 5, and a second ferromagnetic layer 6 as a free magnetization layer are sequentially stacked. A cap nonmagnetic metal layer 7 and a contact metal layer 8 are sequentially formed on the second ferromagnetic layer 6. The cap nonmagnetic metal layer 7 can be omitted. A bias is applied between the first nonmagnetic metal layer 2 or the second nonmagnetic metal layer 3 positioned below and the contact metal layer 8 positioned at the top, and thus electrons having a spin of a specific direction can flow in a direction perpendicular to the surface of the film.

In a case where a direction of magnetization of the fixed magnetization layer is the same as (parallel to) a direction of magnetization of the free magnetization layer (for example, +X-axis direction and +X-axis direction), electrons in which the direction of the spin is equal to the above direction of magnetization pass through the surface of the film in the vertical direction. In a case where the direction of magnetization of the fixed magnetization layer is opposite (antiparallel) to the direction of magnetization of the free magnetization layer (for example: +X-axis direction and −X-axis direction), electrons in which the direction of the spin is opposite to the direction of magnetization are reflected and thus do not pass through the surface of the film.

The direction of magnetization of the first ferromagnetic layer (fixed magnetization layer) 4 is fixed. The direction of magnetization of the second ferromagnetic layer (free magnetization layer) 6 can change in accordance with an external magnetic field. Thus, the quantity of passing electrons changes in accordance with the intensity of the external magnetic field. If the quantity of passing electrons is large, resistance is low. If the quantity of passing electrons is small, resistance is high. The first ferromagnetic layer 4 as the fixed magnetization layer is thicker than the second ferromagnetic layer 6, and has more difficulty in changing the direction of magnetization in accordance with the external magnetic field than the second ferromagnetic layer 6. Thus, the first ferromagnetic layer functions as the fixed magnetization layer in which the direction of magnetization is substantially fixed. An MR ratio is provided as an index for evaluating the performance of a magnetoresistive effect element. The MR ratio is given by [((resistance value of an element in a case where the direction of magnetization is antiparallel)−(resistance value of an element in a case where the direction of magnetization is parallel))/resistance value of an element in a case where the direction of magnetization is parallel].

In FIG. 1, for ease of understanding, the name of a representative material to be used is described in each layer. However, another material may be applied to each layer.

The nonmagnetic spacer layer 5 is provided between the first ferromagnetic layer 4 and the second ferromagnetic layer 6. The nonmagnetic spacer layer 5 includes a nonmagnetic metal layer 5B made of Ag and at least one of a first intermediate layer 5A provided under the nonmagnetic metal layer 5B and a second intermediate layer 5C provided over the nonmagnetic metal layer 5B. That is, a structure in which one of the first intermediate layer 5A and the second intermediate layer 5C is omitted and the nonmagnetic metal layer 5B at the center is in contact with any of the upper and lower ferromagnetic layers can also be made.

The first intermediate layer 5A and the second intermediate layer 5C include a NiAlX alloy layer represented by Formula (1).

$$\text{Formula(1):} Ni_{\gamma 1} Al_{\gamma 2} X_{\gamma 3} \tag{1}$$

Here, X indicates one or more elements selected from the group consisting of Si, Sc, Ti, Cr, Mn, Fe, Co, Cu, Zr, Nb, and Ta, and satisfies an expression of $0<\gamma<0.5$ in a case of $\gamma=\gamma 3/(\gamma 1+\gamma 2+\gamma 3)$.

That is, in addition to NiAlX alloys formed with combinations of Ni—Al—Si, Ni—Al—Sc, Ni—Al—Ti, Ni—Al—Cr, Ni—Al—Mn, Ni—Al—Fe, Ni—Al—Co, Ni—Al—Cu, Ni—Al—Zr, Ni—Al—Nb, Ni—Al—Ta, and the like, NiAlX alloys such as V—Ni—Al, Ni—Al—Ge, Ni—Al—Sn, Ni—Al—Sb, and Hf—Ni—Al, in which electrical properties and a lattice constant on a crystal structure are close to those of the above-described NiAlX alloys, can be used.

In this case, the lattice matching property between any intermediate layer (first intermediate layer 5A or second intermediate layer 5C) including the NiAlX alloy layer and the nonmagnetic metal layer 5B including Cu, Ag, or the like is improved. In addition, the lattice matching property between the intermediate layer (first intermediate layer 5A or second intermediate layer 5C) and the ferromagnetic layer (first ferromagnetic layer 4 or second ferromagnetic layer 6) positioned on the outside of the intermediate layer can also be improved. Thus, it is possible to reduce the region of the above-described dead layer and to improve spin injection efficiency.

The material and the thickness (preferable range) of each layer as a preferred example are as follows.

Contact metal layer 8: Ru, 5 nm, (3 nm to 8 nm)
Cap nonmagnetic metal layer 7: Ag, 5 nm, (3 nm to 8 nm)
Second ferromagnetic layer 6: CMS (cobalt manganese silicon alloy), 5 nm, (3 nm to 20 nm)
Second intermediate layer 5C: NiAlX alloy ($Ni_{\gamma1}Al_{\gamma2}X_{\gamma3}$) 1 nm, (0.1 nm to 15 nm)
Nonmagnetic metal layer 5B: Ag, 5 nm, (3 nm to 10 nm)
First intermediate layer 5A: NiAlX alloy ($Ni_{\gamma1}Al_{\gamma2}X_{\gamma3}$), 1 nm, (0.1 nm to 15 nm)
First ferromagnetic layer 4: CMS (cobalt manganese silicon alloy), 10 nm, (3 nm to 20 nm)
Second nonmagnetic metal layer 3: Ag, 50 nm, (20 nm to 100 nm)
First nonmagnetic metal layer 2: Cr, 20 nm, (10 nm to 30 nm)
Substrate 1: MgO, 0.5 mm, (0.1 mm to 2 mm)

The above-described thickness of each layer may not be limited to the above range unless the layer is used in the magnetoresistive effect element.

Next, a material example of each layer constituting the magnetoresistive effect element will be described more.

Preferably, Ru can be used for the contact metal layer 8. In addition, for example, the contact metal layer may include a stacked structure of a material made of one or more metal elements of Ru, Ag, Al, Cu, Au, Cr, Mo, Pt, W, Ta, Pd, and Ir, alloys of the above metal elements, or two kinds or more of the above metal elements.

Preferably, Ag can be used for the cap nonmagnetic metal layer 7. In addition, for example, the cap nonmagnetic metal layer may include a stacked structure of a material made of one or more metal elements of Ru, Ag, Al, Cu, Au, Cr, Mo, Pt, W, Ta, Pd, and Ir, alloys of the above metal elements, or two kinds or more of the above metal elements.

Preferably, CMS ($Co_2L_\alpha M_\beta$) which is a Heusler alloy can be used for the second ferromagnetic layer 6. In addition, the second ferromagnetic layer can include Heusler alloys such as $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ or include ferromagnetic materials such as $Fe_3O_4$, $CrO_2$, and CoFeB. Alternatively, the second ferromagnetic layer can be made of substantially the ferromagnetic material. In a case where the number of atoms of Co is set to 2, $Co_2L_\alpha M_\beta$ indicates that the percentage of the number of atoms of L constituting all the alloys with M is a, and the percentage of the number of atoms of M is β.

Preferably, CMS ($Co_2L_\alpha M_\beta$) which is a Heusler alloy can be used for the first ferromagnetic layer 4. In addition, the first ferromagnetic layer can include Heusler alloys such as $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGaSn$, $Co_2FeGeGa$, $Co_2MnGeGa$, $Co_2FeGaSi$, $Co_2FeGeSi$, $Co_2CrIn$, and $Co_2CrSn$ or include ferromagnetic materials such as $Fe_3O_4$, $CrO_2$, and CoFeB. Alternatively, the first ferromagnetic layer can be made of substantially the ferromagnetic material.

Preferably, Ag can be used for the second nonmagnetic metal layer 3. In addition, the second nonmagnetic metal layer may include a stacked structure of a material which includes, for example, at least one metal element of Ag, Au, Cu, Cr, V, Al, W, and Pt and is made of alloys of the above metal elements or two kinds or more of the above metal elements. The alloys of the metal elements include, for example, cubic AgZn alloys, AgMg alloys, and NiAl alloys.

Preferably, Cr can be used for the first nonmagnetic metal layer 2. In addition, the first nonmagnetic metal layer may include a stacked structure of a material which includes, for example, at least one metal element of Ag, Au, Cu, Cr, V, Al, W, and Pt and is made of alloys of the above metal elements or two kinds or more of the above metal elements, in order to control crystal alignment of the upper layer. The alloys of the metal elements include, for example, cubic AgZn alloys, AgMg alloys, and NiAl alloys.

Preferably, MgO can be used for the substrate 1. The material of the substrate is not particularly limited so long as the material has adequate mechanical strength and is suitable for heating treatment or microfabrication. For example, metal oxide single crystal substrate, silicon single crystal substrate, silicon single crystal substrate with a thermal oxide film, sapphire single crystal substrate, ceramic, quartz, and glass can be used. If a substrate includes MgO single crystal substrate, an epitaxial growth film is easily formed. The epitaxial growth film can exhibit large magnetoresistance characteristics.

Next, superiority of the above-described configuration to that in a comparative example will be described.

Figure 2:
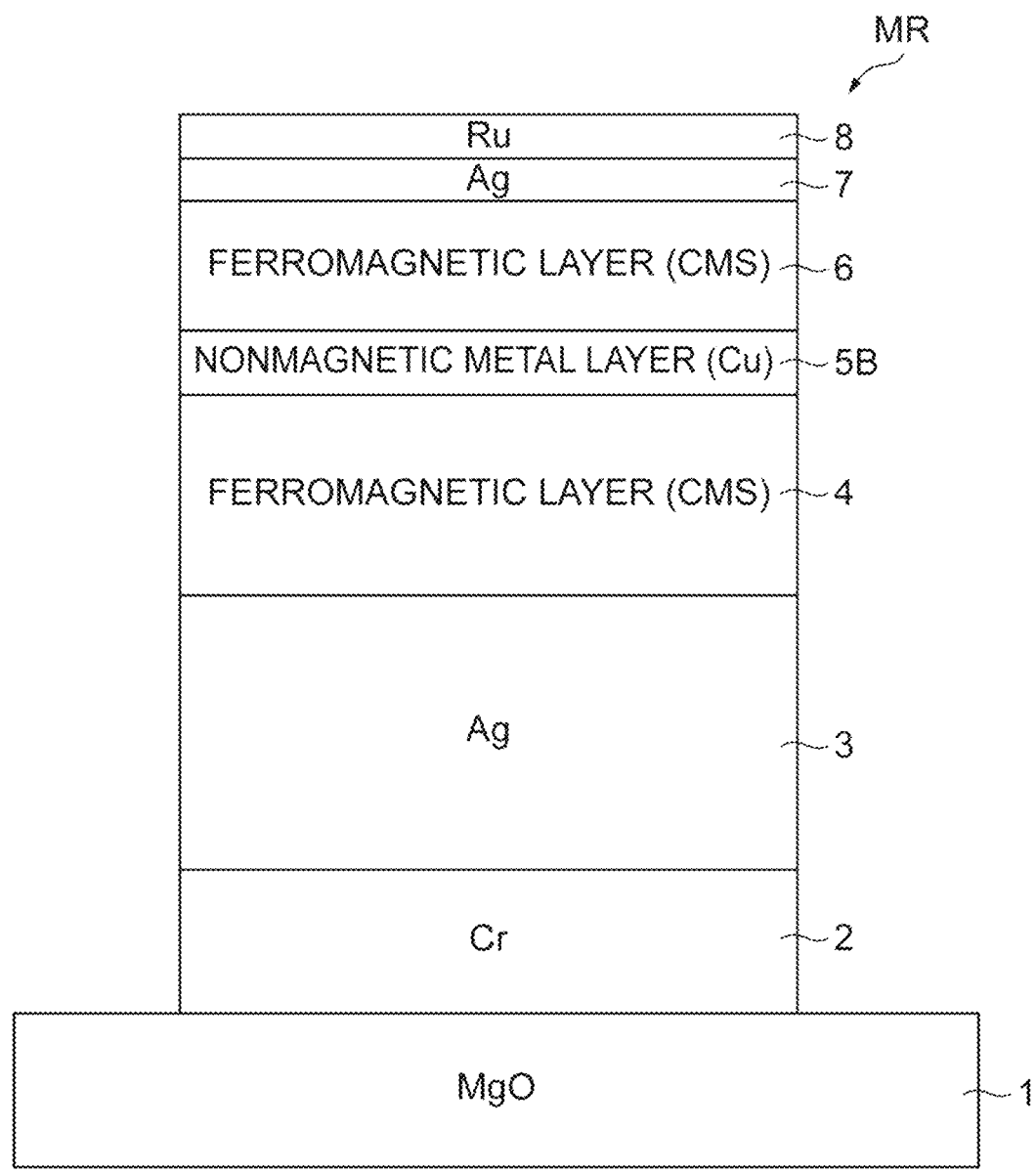
FIG. 2 is a front view illustrating a magnetoresistive effect element MR according to a comparative example.

FIG. 2 is a front view illustrating a magnetoresistive effect element MR according to a comparative example.

The basic configuration of the magnetoresistive effect element according to the comparative example is obtained by removing the intermediate layer (first intermediate layer 5A or second intermediate layer 5C) made of the NiAlX alloy from the magnetoresistive effect element illustrated in FIG. 1. Other components are the same as those illustrated in FIG. 1.

FIG. 3 is a table illustrating a relationship between γ and the thickness (nm) of a dead layer in the intermediate layer represented by Formula (1): $Ni_{\gamma1}Al_{\gamma2}X_{\gamma3}$ in the structure in the example (structure in the preferred example).

FIG. 3 illustrates a case (set to be Example R) in which $Co_2Mn_{1.0}Si_{1.0}$ is used for the second ferromagnetic layer 6 in the stacked structure in which only the nonmagnetic metal layer 5B, the intermediate layer 5C, and the second ferromagnetic layer 6 are formed on the substrate 1 in the structure in FIG. 1. That is, the nonmagnetic metal layer 5B, the intermediate layer 5C, and the second ferromagnetic layer 6 are directly and sequentially formed on the substrate 1. The material and the thickness of each layer are as follows.

Second ferromagnetic layer 6: $Co_2Mn_{1.0}Si_{1.0}$, 10 nm
Second intermediate layer 5C: $Ni_{\gamma1}Al_{\gamma2}X_{\gamma3}$, 10 nm
Nonmagnetic metal layer 5B: Ag, 100 nm
Substrate 1: MgO, 0.5 mm As Comparative Example A, a configuration obtained by removing only the intermediate layer from Example R was prepared. The material and the thickness thereof are as follows.

Second ferromagnetic layer 6: $Co_2Mn_{1.0}Si_{1.0}$, 10 nm
Second intermediate layer 5C: none
Nonmagnetic metal layer 5B: Ag, 100 nm
Substrate 1: MgO, 0.5 mm The dead layer is 0.8 nm in Comparative Example A. Even in a case using any of Si, Sc, Ti, Cr, Mn, Fe, Co, Cu, Zr, Nb, and Ta as X in Example R, the thickness of the dead layer is reduced. The stacked structure in Example R includes the NiAlX alloy represented by Formula (1) such that the lattice mismatch between the ferromagnetic layer 6 and the nonmagnetic metal layer 5B is reduced in comparison to a case (Comparative Example A) where the ferromagnetic layer and the nonmagnetic metal layer are directly in contact with each other. Therefore, according to the stacked structure, the dead layer in the ferromagnetic layer and the nonmagnetic metal layer is reduced. In this case, since the intermediate layer 5C is provided, the lattice mismatch between the nonmagnetic metal layer 5B and the ferromagnetic layer 6 is alleviated, and crystallinity thereof is improved. Thus, the region of the dead layer is reduced. Accordingly, a region which acts magnetically expands, and thus it is possible to increase the MR ratio and to improve spin injection efficiency. In particular, in a case where γ is within the above range (0<γ<0.5), the region of the dead layer is particularly reduced.

In a case where γ is within the above range (0<γ<0.3), it is possible to more reduce the region of the dead layer, to increase the MR ratio, and to improve spin injection efficiency. In the stacked structure, since the crystal structure of the NiAlX alloy layer is stable, it is possible to obtain a face-centered cubic lattice structure. As a result, it is possible to alleviate lattice mismatch between the ferromagnetic layer and the nonmagnetic metal layer and to reduce the region of the dead layer.

In a case where X in the intermediate layer (NiAlX alloy layer) is an element selected from the group consisting of Si, Cr, Fe, Co, and Zr, the relationship as follows can be established: the lattice constant-corresponding reference value of the ferromagnetic layer≤ the lattice constant-corresponding reference value of the NiAlX alloy layer≤ the lattice constant-corresponding reference value of the nonmagnetic metal layer; or the lattice constant-corresponding reference value of the ferromagnetic layer≥ the lattice constant-corresponding reference value of the NiAlX alloy layer≥the lattice constant-corresponding reference value of the nonmagnetic metal layer. Thus, the lattice mismatch between the ferromagnetic layer and the nonmagnetic metal layer is alleviated. Here, the lattice constant-corresponding reference value means any one value of a lattice constant a and a value of two times the lattice constant a when crystal planes thereof are aligned in a state of being inclined by 0 degrees. The lattice constant-corresponding reference value means a value obtained by multiplying a by the square root of 2 when the crystal planes of the layers are aligned in a state of being inclined by 45 degrees. Therefore, according to the stacked structure, the dead layer in the ferromagnetic layer and the nonmagnetic metal layer is reduced. The relationship between the lattice constants can be established even though the number of elements to be selected is equal to or greater than 1.

In addition, the thickness of the dead layer in a case of changing the intermediate layer and the ferromagnetic layer was examined.

FIG. 4 is a table illustrating the thickness and the like of the dead layer in a magnetoresistive effect element (Comparative Example 1, Examples 1 to 5).

In Example 1 to Example 5, a stacked structure in which only the nonmagnetic metal layer 5B, the intermediate layer 5C, and the second ferromagnetic layer 6 are formed on the substrate 1 in the structure in FIG. 1 is provided. That is, the nonmagnetic metal layer 5B, the intermediate layer 5C, and the second ferromagnetic layer 6 are directly and sequentially formed on the substrate 1. The material and the thickness of each layer are as follows.

Example 1

Second ferromagnetic layer 6: $Co_2TiSn$, 5 nm
Second intermediate layer 5C: $NbNi_2Al$, 50 nm
Nonmagnetic metal layer 5B: Cu, 50 nm
Substrate 1: MgO, 0.5 mm Example 2

Second ferromagnetic layer 6: $Co_2Mn_{1.3}Si_{0.95}$, 5 nm
Second intermediate layer 5C: $NbNi_2Al$, 50 nm
Nonmagnetic metal layer 5B: Cu, 50 nm
Substrate 1: MgO, 0.5 mm Example 3

Second ferromagnetic layer 6: $Co_2Mn_{1.3}Si_{0.95}$, 5 nm
Second intermediate layer 5C: $NbNi_2Al$, 50 nm
Nonmagnetic metal layer 5B: Ag, 50 nm
Substrate 1: MgO, 0.5 mm Example 4

Second ferromagnetic layer 6: $Co_2Mn_{1.3}Si_{0.95}$, 5 nm
Second intermediate layer 5C: $Cr_{0.66}Ni_{0.67}Al_{0.67}$, 50 nm
Nonmagnetic metal layer 5B: Ag, 50 nm
Substrate 1: MgO, 0.5 mm Example 5

Second ferromagnetic layer 6: $Co_2Mn_{1.3}Si_{0.95}$, 5 nm
Second intermediate layer 5C: $CrNi_2Al$, 50 nm
Nonmagnetic metal layer 5B: Ag, 50 nm
Substrate 1: MgO, 0.5 mm In Comparative Example 1, a stacked structure in which only the nonmagnetic metal layer 5B and the second ferromagnetic layer 6 are formed on the substrate 1 in the structure in FIG. 2 is provided. That is, the nonmagnetic metal layer 5B and the second ferromagnetic layer 6 are directly and sequentially formed on the substrate 1. The material and the thickness of each layer are as follows.

Comparative Example 1

Second ferromagnetic layer 6: $Co_2TiSn$, 5 nm
Nonmagnetic metal layer 5B: Cu, 50 nm
Substrate 1: MgO, 0.5 mm The followings are understood from the results in FIG. 4.

The thickness t2 of the dead layer in Example 1 is smaller than the thickness t2 of the dead layer in Comparative Example 1, and the intermediate layer is used. Thus, crystal quality is improved.

The thickness t2 of the dead layer in Example 2 is equal to the thickness t2 of the dead layer in Example 1 and is smaller than that in Comparative Example 1. Thus, excellent crystal quality is obtained.

It is shown that the nonmagnetic metal layer is made of Ag having a lattice constant close to the lattice constant of the NiAlX alloy layer, and thus the thickness t2 of the dead layer in Example 3 is largely smaller than that in Example 2.

The thickness t2 of the dead layer in Example 4 is smaller than the thickness t2 of the dead layer in Example 3, and the material of the intermediate layer is changed. Thus, crystal quality is improved.

The thickness t2 of the dead layer in Example 5 is smaller than the thickness t2 of the dead layer in Example 4, and the composition of the material of the intermediate layer is changed. Thus, crystal quality is improved.

Next, the thickness t1 of the intermediate layer 5C was examined.

Figure 6:
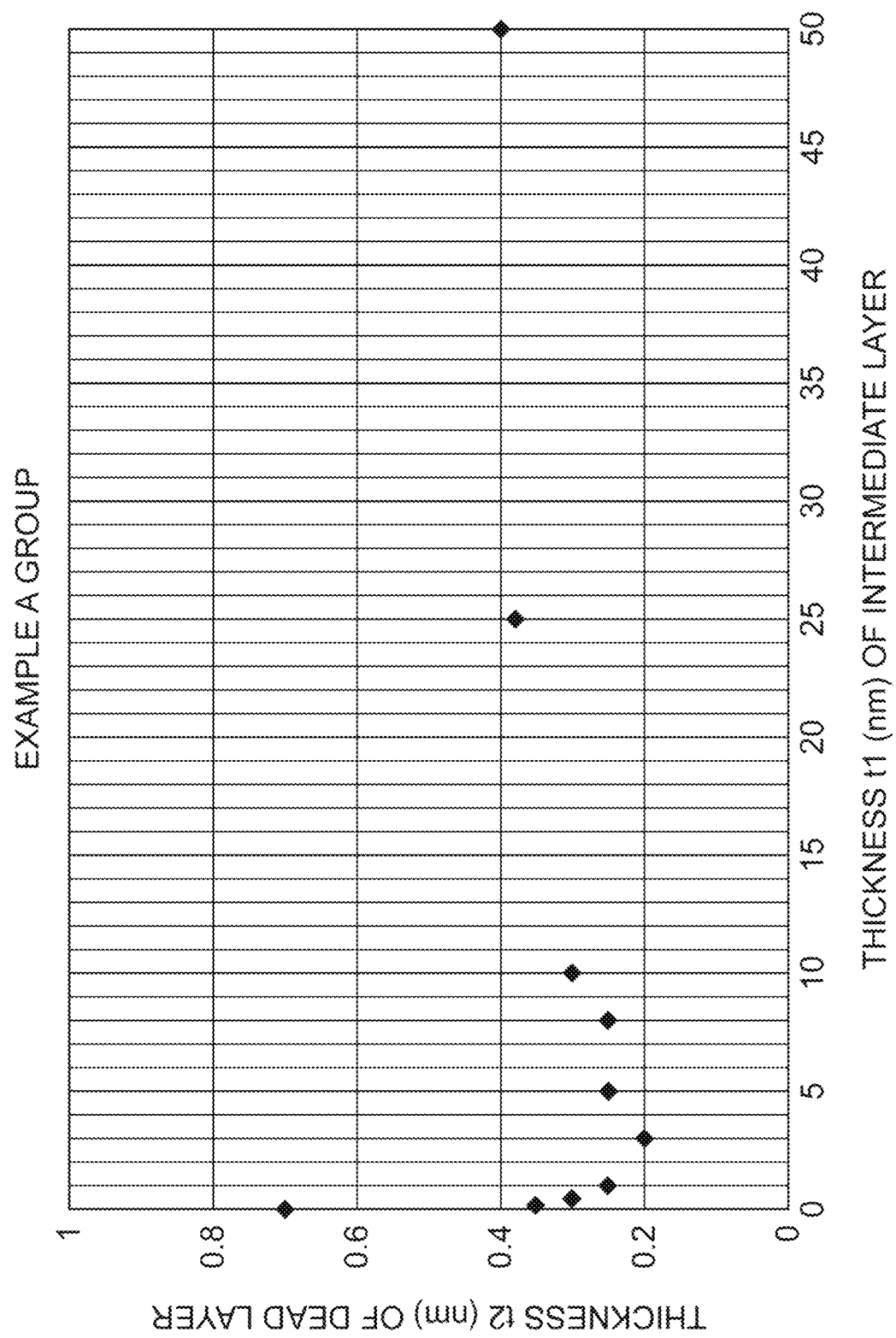
FIG. 6 is a graph illustrating a relationship between the thickness t1 (nm) of the intermediate layer and the thickness t2 (nm) of the dead layer in the Example A group.

FIG. 5 is a table illustrating a relationship between the thickness t1 (nm) of the intermediate layer 5C and the thickness t2 (nm) of the dead layer in Example A group. FIG. 6 is a graph illustrating a relationship between the thickness t1 (nm) of the intermediate layer 5C and the thickness t2 (nm) of the dead layer in an Example A group.

The magnetoresistive effect element in the Example A group has a structure similar to that in Example 5 except that the thickness t1 of the intermediate layer 5C is changed. The magnetoresistive effect element in the Example A group has materials and thicknesses as follows.

(Example A Group)
Second ferromagnetic layer 6: $Co_2Mn_{1.3}Si_{0.95}$, 5 nm
Second intermediate layer 5C: $CrNi_2Al$ (0.1 nm to 50 nm)
Nonmagnetic metal layer 5B: Ag, 50 nm
Substrate 1: MgO, 0.5 mm In the stacked structure, when the thickness of the intermediate layer (NiAlX alloy layer) 5C is set as t1, t1 preferably satisfies the following relational expression.

$$0.2 \text{ nm} \leq t1 \leq 10 \text{ nm}$$

That is, at time of t1≤10 nm, in electrons which move from the ferromagnetic layer or to the ferromagnetic layer, an occurrence of spin scattering is more reduced. At time of 0.2 nm≤t1, the lattice mismatch between the ferromagnetic layer and the nonmagnetic metal layer is more reduced. As a result, the thickness t2 of the dead layer in the ferromagnetic layer and the nonmagnetic metal layer is reduced.

Next, the composition ($\alpha$, $\beta$) of the ferromagnetic layer (4, 6) was examined.

FIG. 7 is a table illustrating a relationship ($\beta$ is 0.95) between various parameters ($\alpha+\beta$, $\alpha$, and $\beta$) and the MR ratio (%) in $Co_2L_\alpha M_\beta$ (L=Mn, M=Si) forming the ferromagnetic layer (4, 6) in an Example B group.

The magnetoresistive effect element in the Example B group has a structure in FIG. 1, and has materials and thicknesses as follows except that the composition of the ferromagnetic layer is changed. $\beta$ is a fixed value of 0.95 and $\alpha$ is changed from 0.5 to 1.8.

Contact metal layer 8: Ru, 5 nm
Cap nonmagnetic metal layer 7: Ag, 5 nm
Second ferromagnetic layer 6: $Co_2L_\alpha M_\beta$ (L=Mn, M=Si), 5 nm
Second intermediate layer 5C: $CrNi_2Al$, 1 nm
Nonmagnetic metal layer 5B: Ag, 5 nm
First intermediate layer 5A: $CrNi_2Al$, 1 nm
First ferromagnetic layer 4: $Co_2L_\alpha M_\beta$ (L=Mn, M=Si), 10 nm
Second nonmagnetic metal layer 3: Ag, 50 nm
First nonmagnetic metal layer 2: Cr, 20 nm
Substrate 1: MgO, 0.5 mm FIG. 8 is a table illustrating a relationship ($\alpha$ is 1.3) between various parameters ($\alpha+\beta$, $\alpha$, and $\beta$) and the MR ratio (%) in the ferromagnetic layer ($Co_2L_\alpha M_\beta$) in an Example C group.

The magnetoresistive effect element in the Example C group has a structure in FIG. 1 and has materials and thicknesses which are the same as those in the Example B group except that the composition of the ferromagnetic layer is changed. $\alpha$ is a fixed value of 1.3 and $\beta$ is changed from 0.55 to 1.45.

In a case where Mn is set as L, Si is set as M, and $\alpha$ and $\beta$ have positive values, the ferromagnetic layer (4, 6) includes the Heusler alloy represented by Formula (2).

$$Co_2L_\alpha M_\beta \quad (2)$$

In a case where the ferromagnetic layer (4, 6) is made of the Heusler alloy, the lattice constant of the NiAlX alloy is close. Thus, crystallinity is improved, and spin injection efficiency is improved.

Figure 9:
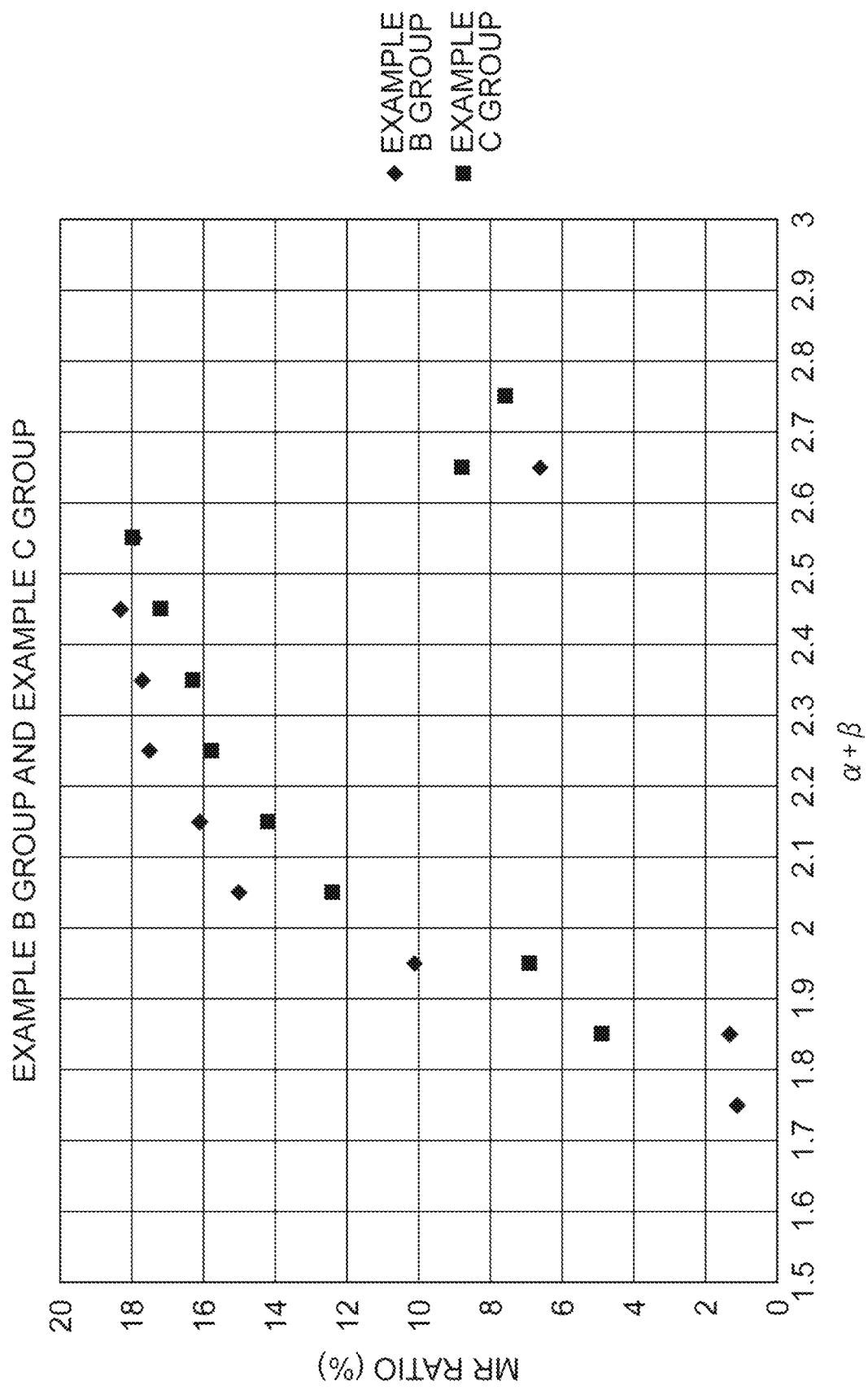
FIG. 9 is a graph illustrating a relationship between the parameter of (α+β) and the MR ratio (%) in the Example B group and the Example C group.

FIG. 9 is a graph illustrating a relationship between the parameter of ($\alpha+\beta$) and the MR ratio (%) in the Example B group and the Example C group.

The followings are understood from FIG. 9.

In the Heusler alloy represented by Formula (2), it is preferable that $\alpha$ and $\beta$ satisfy the following relational expressions (2-1), (2-2), and (2-3).

$$0.7 < \alpha < 1.6 \quad (2\text{-}1),$$

$$0.65 < \beta < 1.35 \quad (2\text{-}2), \text{ and}$$

$$2 < \alpha+\beta < 2.6 \quad (2\text{-}3)$$

According to the stacked structure, the expressions of $0.7<\alpha<1.6$ and $0.65<\beta<1.35$ are satisfied. Thus, the Heusler alloy for the ferromagnetic layer (4, 6) has a lattice constant close to that in a case of having a stoichiometric composition, and the lattice matching property with the NiAlX alloy is favorable. Since the expression of $2<\alpha+\beta<2.6$ is satisfied, the Heusler alloy as the NiAlX alloy for the ferromagnetic layer easily holds the half-metal characteristics, and thus it is possible to obtain a large magnetoresistive effect (MR ratio).

The ferromagnetic layer (4, 6) can include the Heusler alloy represented by Formula (2): $Co_2L_\alpha M_\beta$ . . . (2), in a case where L indicates one or more elements selected from the group consisting of Mn and Fe, M indicates one or more elements selected from the group consisting of Si, Al, Ga, and Ge, and $\alpha$ and $\beta$ are set to have positive values. As described above, in a case where the ferromagnetic layer (4, 6) is made of the Heusler alloy, crystallinity is improved, and spin injection efficiency is improved.

In a case where L and M are the above elements, the Heusler alloy for the ferromagnetic layer has a lattice constant-corresponding reference value close to that of the NiAlX alloy layer represented by Formula (1). Even though the number of the above element is not one but one or more, it is easily estimated that the ferromagnetic layer has a lattice constant close to that of the NiAlX alloy layer. Thus, it is possible to hold crystallinity and magnetic quality of the ferromagnetic layer to be favorable. As a result, it is possible to more reduce the dead layer in the ferromagnetic layer and the nonmagnetic metal layer. Here, the lattice constant-corresponding reference value means any one value of a lattice constant a and a value of two times the lattice constant a when crystal planes thereof are aligned in a state of being inclined by 0 degrees. The lattice constant-corresponding reference value means a value obtained by multiplying a by the square root of 2 when the crystal planes of the layers are aligned in a state of being inclined by 45 degrees.

From a viewpoint similar to the above descriptions, the following ranges are further preferable.

$0.8 \leq \alpha \leq 1.5$ (2-1')

$0.75 \leq \beta \leq 1.25$ (2-2'), and $2.05 \leq \alpha+\beta \leq 2.55$ (2-3').

Next, the lattice constant of each layer will be considered.

In FIG. 1, the nonmagnetic metal layer 5B is made of Ag, and the first intermediate layer 5A and the second intermediate layer 5C are made of the NiAlX alloy. However, X is an element selected from the group consisting of Si, Sc, Ti, Cr, Mn, Fe, Co, Cu, Zr, Nb, and Ta. X may include one element among the above elements or may include two or more elements (X1 and X2). In this case, approximately, for example, an intermediate value between the lattice constant in a case using X1 and the lattice constant in a case using X2 can be obtained as the lattice constant. The value of $\gamma$ has a range of $0<\gamma<0.5$.

FIGS. 10 and 11 show lattice constants a of NiAlSi, $NiAl_{0.75}Si_{0.25}$, $ScNi_2Al$, $TiNi_2Al$, $TiNl_{0.25}Al_{2.75}$, $CrNi_2Al$, $Cr_{0.66}Ni_{0.67}Al_{0.67}$, $MnNi_2Al$, $Mn_{0.5}Ni_{0.5}Al$, $Fe_2NiAl$, $Co_{0.5}Ni_{0.5}Al$, $Cu_{0.4}Ni_{0.6}Al$, $ZrNi_2Al$, $ZrNi_{0.48}Al_{2.52}$, $NbNi_2Al$, and $TaNi_2Al$, 2a, values obtained by multiplying a by the square root of 2, the structure type of crystal, and the Pearson symbol. In a case where the intermediate layer (5A, 5C) grows while rotating by 45° with respect to a crystal axis of the ferromagnetic layer (4, 6) adjacent to the intermediate layer, in the vertical direction, the value obtained by multiplying a by the square root of 2 is close to the lattice constant of the ferromagnetic layer. Twice (2a) of the lattice constant of the intermediate layer may be close to the lattice constant of the ferromagnetic layer. The (*) mark in FIGS. 10 and 11 indicates a value for which the lattice constant is close to the adjacent ferromagnetic layer (4, 6). In order to obtain lattice matching, a, 2a, or the value obtained by multiplying a by the square root of 2, with the (*) mark, is selected.

FIG. 12 is a table illustrating lattice constants of the ferromagnetic layer (4, 6) (various Heusler alloys).

FIG. 12 shows lattice constants a of $Co_2MnSi$, $Co_2MnGe$, $Co_2MnGa$, $Co_2FeGa$, $Co_2FeSi$, $Co_2MnSn$, $Co_2MnAl$, $Co_2FeAl$, $Co_2CrAl$, $Co_2VAl$, $Co_2MnGa_{0.5}Sn_{0.5}$, and $Co_2FeGeGa$.

FIGS. 13 to 16 are tables illustrating the lattice mismatch ratios between Ag (nonmagnetic metal layer) or the NiAlX alloy (intermediate layer), and the various Heusler alloys (ferromagnetic layer).

The lattice mismatch ratio is obtained by [((the lattice constant a of Ag or the intermediate layer, 2a, or the value obtained by multiplying a by the square root of 2)−(lattice constant of the ferromagnetic layer))/(the lattice constant of the ferromagnetic layer)].

Among combinations of the above materials, the combination having a small lattice mismatch ratio can cause the MR ratio to increase. Specifically, if a NiAlX alloy (intermediate layer) having a lattice mismatch ratio which is smaller than the lattice mismatch ratios between Ag (nonmagnetic metal layer) and the various Heusler alloys (ferromagnetic layer) is provided, it is possible to reduce the dead layer and to increase the MR ratio. Because of the junction between materials of different kinds, the absolute value of the lattice mismatch ratio is greater than zero. The lattice constant means a value at room temperature (300 K).

The nonmagnetic metal layer 5B can include one or more elements selected from the group consisting of Ag, Cr, Al, Au, and NiAl. According to the nonmagnetic metal layer, it is possible to easily suppress an occurrence of a situation in which the X element is diffused into the nonmagnetic metal layer. It is not necessary that one element having a diffusion coefficient smaller than that of the X element is provided. It is considered that, if the number of such elements is equal to or greater than 1, a diffusion suppression effect is obtained. As the materials, materials having a lattice constant which is closed to that of the intermediate layer can be provided.

Figure 17:
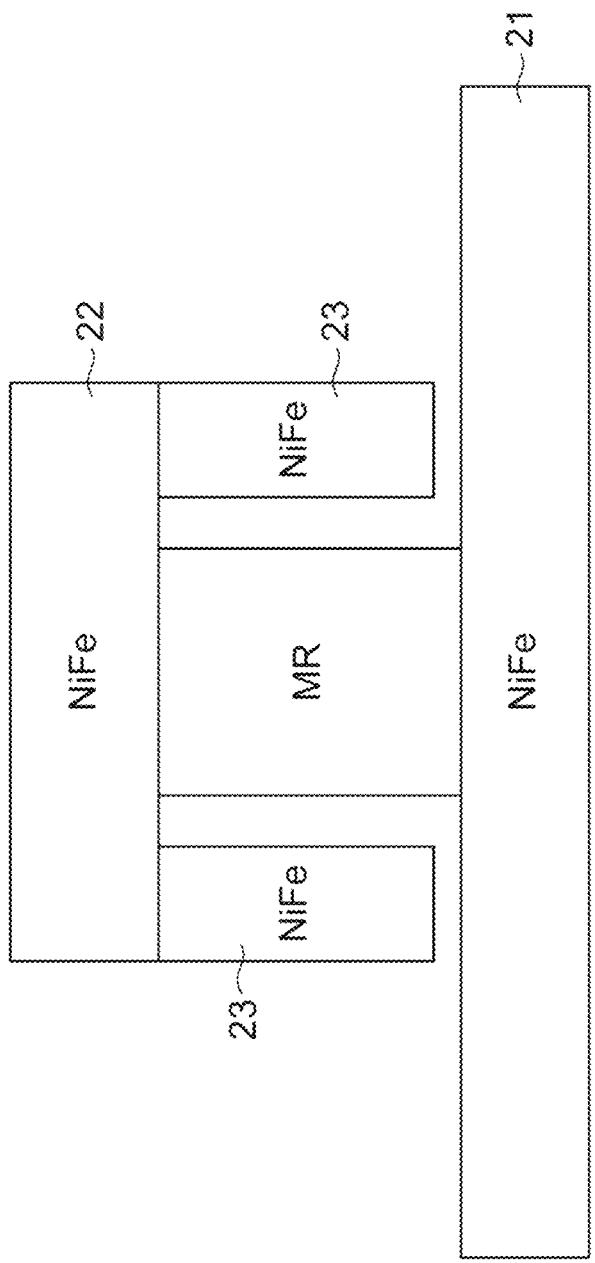
FIG. 17 is a diagram illustrating a sectional configuration of a reproduction unit of a magnetic head including the magnetoresistive effect element.

FIG. 17 is a diagram illustrating a sectional configuration of a reproduction unit of a magnetic head including the magnetoresistive effect element.

The magnetic head includes the magnetoresistive effect element MR illustrated in FIG. 1. Specifically, the magnetic head includes a lower magnetic shield 21, the magnetoresistive effect element MR fixed on the magnetic shield, an upper magnetic shield 22 fixed to the upper portion of the magnetoresistive effect element MR, and a side magnetic shield 23 fixed to the surrounding of the upper magnetic shield 22. The magnetic shield is made of NiFe and the like. The magnetic head having such a structure is known well. The magnetic head disclosed in U.S. Pat. No. 5,695,697 can be used and be incorporated by reference.

Figure 18:
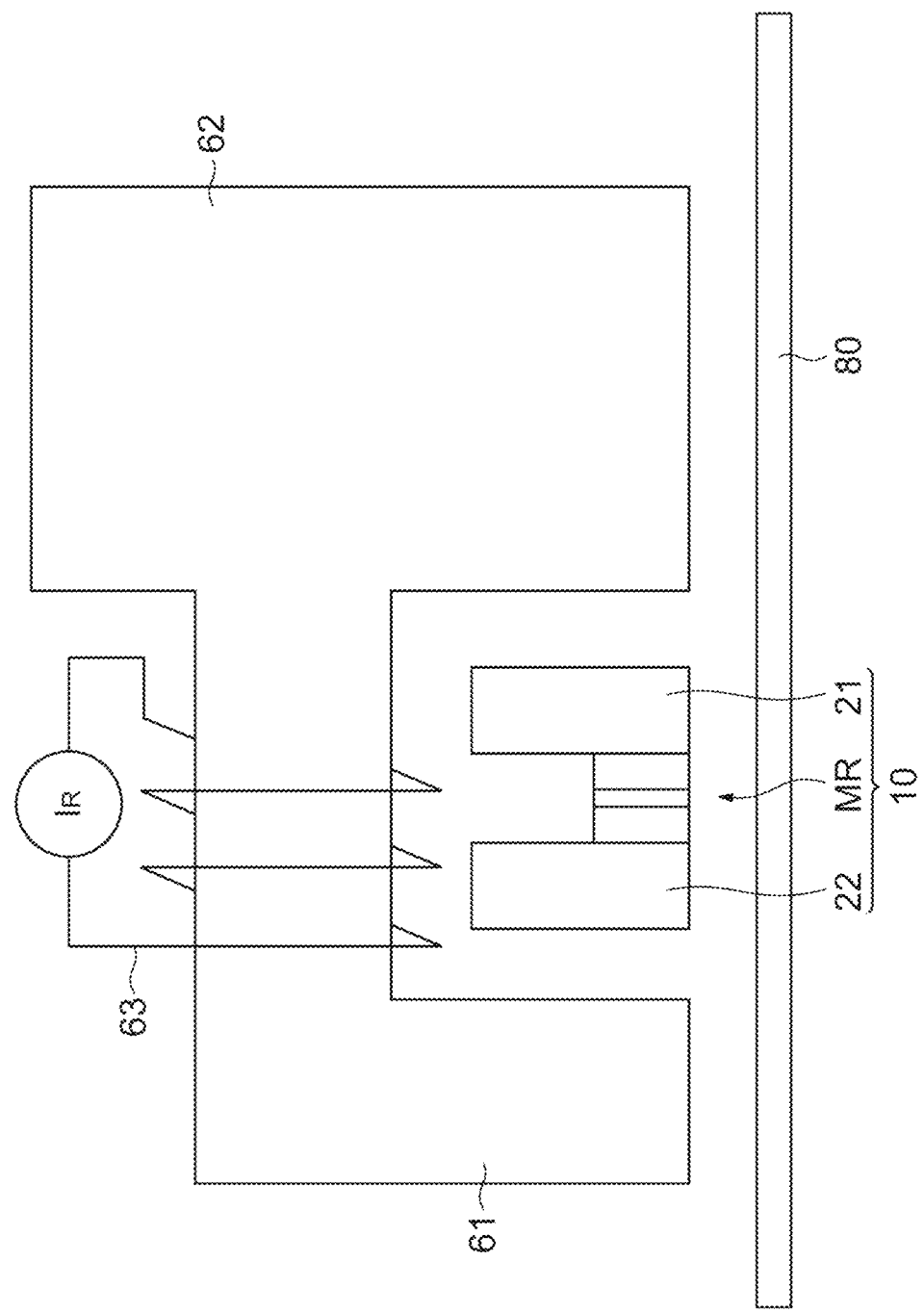
FIG. 18 is a diagram illustrating a sectional configuration of the magnetic head including the magnetoresistive effect element.

FIG. 18 is a diagram illustrating a sectional configuration of the magnetic head including the magnetoresistive effect element MR.

The magnetic recording head includes a main magnetic pole 61, a circulating magnetic pole 62, and a spin torque oscillator 10 disposed to be parallel to the main magnetic pole 61. The spin torque oscillator 10 has a structure similar to that of the above-described magnetic head. The spin torque oscillator has a structure in which the lower magnetic shield 21 and the upper magnetic shield 22 as electrodes are disposed over and under the magnetoresistive effect element MR.

A coil 63 is wound around the base end portion of the main magnetic pole 61. Thus, if a drive current is supplied to a current source IR, a write magnetic field is generated around the main magnetic pole 61. The generated magnetic field forms a closed magnetic path through the magnetic pole.

If a DC current flows between the upper and lower electrodes of the spin torque oscillator 10 including the magnetoresistive effect element MR, ferromagnetic resonance occurs by spin torque which is generated by a spin injection layer, and thus a high-frequency magnetic field is generated from the spin torque oscillator 10. High-density magnetic recording is performed on a magnetic recording medium 80 facing a recording magnetic field generated by the main magnetic pole 61 and a high-frequency magnetic field generated by the spin torque oscillator 10, only at a portion at which the recording magnetic field is superimposed on the high-frequency magnetic field. The magnetic head having such a structure is known well. The magnetic head disclosed in U.S. Pat. No. 5,173,750 can be used and be incorporated by reference.

Figure 19:
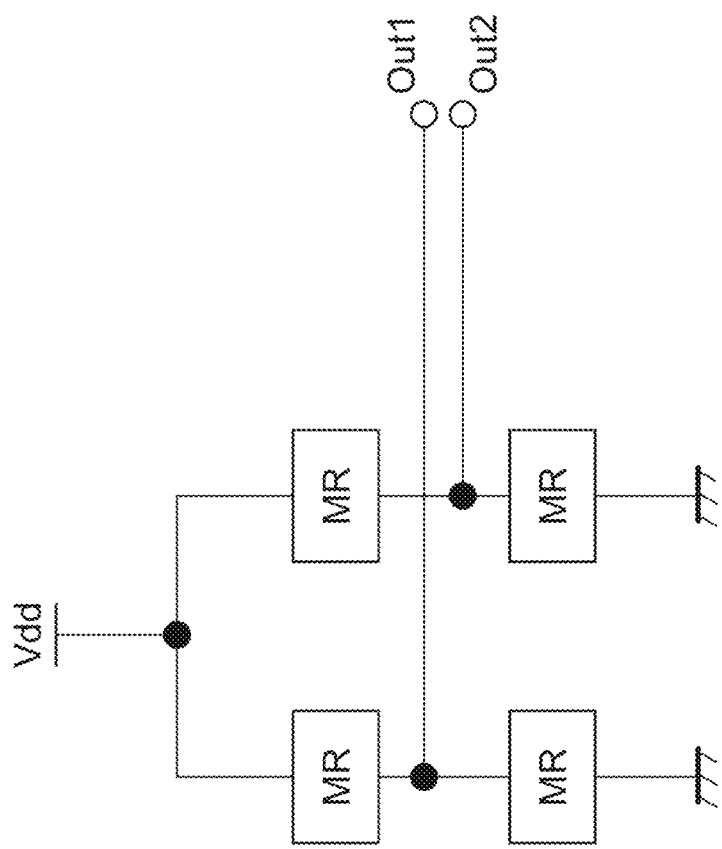
FIG. 19 is a diagram illustrating a structure of a current sensor including a plurality of magnetoresistive effect elements.

FIG. 19 is a diagram illustrating a structure of a current sensor including a plurality of magnetoresistive effect elements.

The current sensor is configured with a bridge circuit obtained by electrically connecting a plurality of magnetoresistive effect elements MR. In FIG. 19, a bridge circuit is configured with four magnetoresistive effect elements MR. Two circuit rows in which the two magnetoresistive effect elements MR are connected to each other in series are connected in parallel between the ground potential and the power supply potential Vdd. Connection points between the two magnetoresistive effect elements MR serve as a first output terminal Out1 and a second output terminal Out2. A voltage between the first output terminal and the second output terminal is an output signal.

If an electric wire as a measurement target extends along the Z-axis direction, a magnetic field is generated around the electric wire, and the resistance value of the magnetoresistive effect element MR changes in accordance with the intensity of the magnetic field. The magnitude of the output signal depends on the intensity of the magnetic field, that is, an amount of a current flowing in the electric wire. Thus, such a device can function as a current sensor. The device also directly functions as a magnetic sensor that detects the intensity of a magnetic field.

Figure 20:
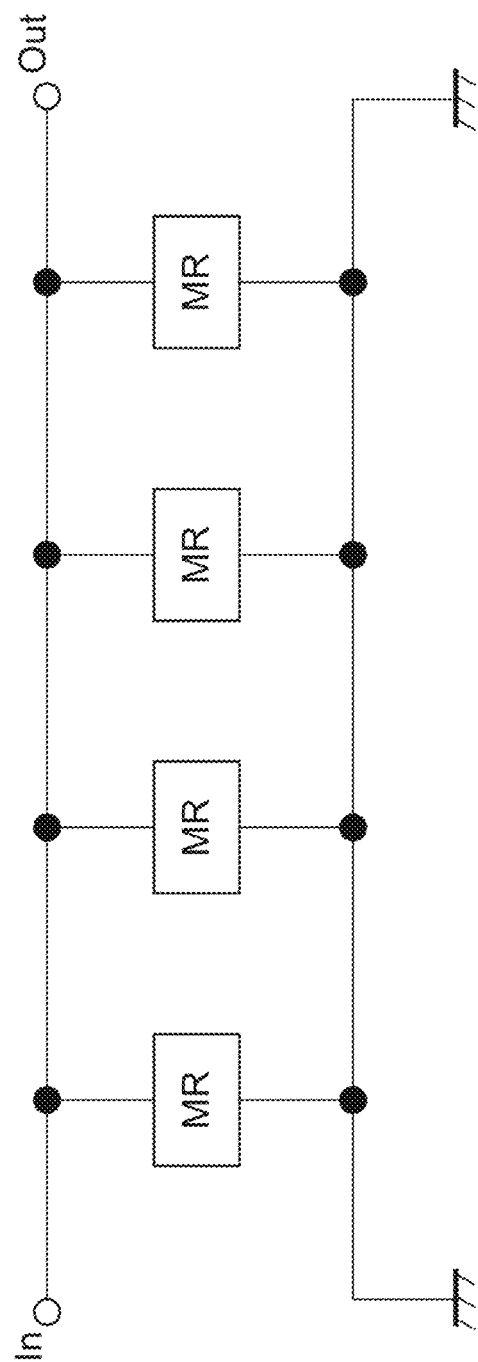
FIG. 20 is a diagram illustrating a structure of a high frequency filter including a plurality of magnetoresistive effect elements.

FIG. 20 is a diagram illustrating a structure of a high frequency filter including a plurality of magnetoresistive effect elements.

The high frequency filter is obtained by electrically connecting a plurality of magnetoresistive effect elements MR in parallel. That is, upper electrodes (shield electrodes or contact electrodes) of the magnetoresistive effect elements MR are connected to each other or are commonly used. In addition, lower electrodes (shield electrodes or first nonmagnetic metal layers) of the magnetoresistive effect elements MR are connected to each other or are commonly used.

The plurality of magnetoresistive effect elements MR has horizontal sectional areas (sectional areas in an XY plane) different from each other, and thus resonance frequencies are different from each other. If a high-frequency signal is input from an input terminal In, the magnetoresistive effect elements MR respectively absorb signal components having frequencies which are equal to resonance frequencies of the magnetoresistive effect elements MR, in the input high-frequency signal. Then, the remaining component of the high-frequency signal is output from the output terminal Out. Thus, the device functions as the high frequency filter. The device having such a structure is known well. For example, the device disclosed in International Publication WO2011/033664 can be used as a reference.

The magnetoresistive effect element in FIG. 1 can be manufactured in a technique as follows.

Firstly, the first nonmagnetic metal layer 2, the second nonmagnetic metal layer 3, the first ferromagnetic layer 4, the nonmagnetic spacer layer 5, the second ferromagnetic layer 6, the cap nonmagnetic metal layer 7, and the contact metal layer 8 are sequentially deposited on the substrate 1. The nonmagnetic spacer layer 5 is formed in a technique that the first intermediate layer 5A, the nonmagnetic metal layer 5B, and the second intermediate layer 5C are deposited on the first ferromagnetic layer 4.

The deposition is performed by a sputtering method which is a well-known technology. In the example, each of the layers is formed at room temperature by using an ultra-high vacuum sputtering machine with a sputtering target made of constituent materials of each of the layers. However, two or more sputtering targets can be simultaneously used. That is, a composition of an alloy film of A and B which are different materials or a composition of the material of each of the layers can be adjusted, by simultaneously sputtering two (or more) targets of A and B. For example, an alloy film can be formed by (simultaneously) sputtering the target of NiAl and the target of another metal X together. Regarding the material of the substrate, a commercially available product can be used. MgO which is a commercially available product is used for the substrate. The first ferromagnetic layer 4 is annealed at 500° C. after film deposition. The second ferromagnetic layer 6 is annealed at 450° C. after film deposition. The magnetoresistive effect element is microfabricated to have a shape of an extent of being capable of evaluating magnetoresistance characteristics, by electron beam lithography and Ar ion milling. Examples of a method of producing CMS and the like using a sputtering machine are disclosed in U.S. Patent Publication No. 2007/0230070, U.S. Patent Publication No. 2013/0229895, U.S. Patent Publication No. 2014/0063648, U.S. Patent Publication No. 2007/0211391, U.S. Patent Publication No. 2013/0335847, and the like, and these documents can be incorporated by reference.

FIG. 21 is a table illustrating materials, lattice constants, film thicknesses, and the MR ratio (%) in a case where the magnetoresistive effect element in FIG. 1 is modified, as Example 6. The structure which is not described is the same as that in a case of FIG. 1. The first intermediate layer 5A and the second intermediate layer 5C have a stacked structure made of a NiAl alloy and the NiAlX alloy. Note that the nonmagnetic metal layer 5B is in contact with NiAl Alloy, and NiAlX alloy is arranged between the NiAl Alloy and the ferromagnetic layers. $Co_2Mn_{1.0}Si_{0.95}$ may be used for the first ferromagnetic layer 4 and the second ferromagnetic layer 6. Other materials and film thicknesses are as follows.

Contact metal layer 8: Ru, 5 nm
Cap nonmagnetic metal layer 7: Ag, 5 nm
Second ferromagnetic layer 6: CMS (cobalt manganese silicon alloy), 5 nm
Second intermediate layer 5C: stacked layer made of NiAl alloy and NiAlX alloy (NiAl alloy on the nonmagnetic metal layer 5B side), each 0.5 nm and total 1 nm
Nonmagnetic metal layer 5B: Ag, 5 nm
First intermediate layer 5A: stacked layer made of NiAl alloy and NiAlX alloy (NiAl alloy on the nonmagnetic metal layer 5B side), each 0.5 nm and total 1 nm
First ferromagnetic layer 4: CMS (cobalt manganese silicon alloy), 10 nm
Second nonmagnetic metal layer 3: Ag, 50 nm
First nonmagnetic metal layer 2: Cr, 20 nm
Substrate 1: MgO, 0.5 mm As in FIG. 21, in a case where the composition of the intermediate layer changes in the thickness direction, the MR ratio increases from 10.1% to 12.3%. Here, the lattice constant (corresponding reference value) of the ferromagnetic layer made of CMS (cobalt manganese silicon alloy) is 0.5606 nm. The lattice constant (corresponding reference value) of the intermediate layer made of $CrNi_2Al$ is 0.5737 nm. The lattice constant (corresponding reference value) of the nonmagnetic metal layer made of Ag is 0.5798. The lattice constant (corresponding reference value) of the NiAlX alloy (that is, NiAl alloy) in which γ is 0 is 0.5760. Thus, since the NiAlX alloy in which γ is 0, that is, the NiAlX alloy having small γ is interposed between the nonmagnetic metal layer and the NiAlX alloy based on the relationship between the lattice constants, the lattice constant (corresponding reference value) changes continuously in the thickness direction of the intermediate layer. Thus, it is possible to more improve crystal quality of the ferromagnetic layer and the nonmagnetic metal layer. Accordingly, it is possible to increase the MR ratio. Here, the lattice constant-corresponding reference value means any one value of a lattice constant a and a value of two times the lattice constant a when crystal planes thereof are aligned in a state of being inclined by 0 degrees. The lattice constant-corresponding reference value means a value obtained by multiplying a by the square root of 2 when the crystal planes of the layers are aligned in a state of being inclined by 45 degrees.

Thus, the value of γ3 can decrease as becoming farther from the ferromagnetic layer (4, 6) in the thickness direction thereof. In the stacked structure, the concentration of the X element on the ferromagnetic layer side in the intermediate layer (5A, 5C) (NiAlX alloy layer) represented by Formula (1) is higher than that in a case of only the ferromagnetic layer being stacked. Thus, lattice mismatch between the ferromagnetic layer (4, 6) and the nonmagnetic metal layer 5B is more reduced. Since the concentration of the X element on the nonmagnetic metal layer 5B side is low, lattice mismatch between the ferromagnetic layer (4, 6) and the nonmagnetic metal layer 5B is more reduced. Therefore, according to the stacked structure, the region of the dead layer in the ferromagnetic layer and the nonmagnetic metal layer is more reduced, and thus it is possible to increase the MR ratio. The value of γ3 can change along an in-plane direction or the thickness direction. The value of γ3 is set and concentration of an X element is changed, in accordance with the degree of local lattice mismatch, such that the lattice mismatch is alleviated. Consequently, an effect of improving quality of the ferromagnetic layer and the nonmagnetic metal layer is expected.

Hitherto, as described above, the stacked structure and the magnetoresistive effect element described above are structural bodies positioned on the nonmagnetic metal layer 5B. The stacked structure includes the ferromagnetic layer 6 and the intermediate layer 5C interposed between the nonmagnetic metal layer 5B and the ferromagnetic layer 6. The intermediate layer 5C includes the NiAlX alloy layer represented by Formula (1): $Ni_{\gamma1}Al_{\gamma2}X_{\gamma3}$ . . . (1), [X indicates one or more elements selected from the group consisting of Si, Sc, Ti, Cr, Mn, Fe, Co, Cu, Zr, Nb, and Ta, and satisfies an expression of $0<\gamma<0.5$ in a case of $\gamma=\gamma3/(\gamma1+\gamma+\gamma3)$]. Thus, it is possible to reduce the dead layer and to obtain a high MR ratio. The magnetic head, the sensor, the high frequency filter, or the oscillator using any of the above-described magnetoresistive effect elements has a large magnetoresistive effect, and thus can exhibit excellent characteristics.

It is considered that, in principle, the movement of the magnetoresistive effect element with respect to the spin in the above structure occurs not only in a CPP-GMR element but also in a CIP-GMR element (in-plane energization GMR element). Thus, it is considered that the above-described structure is also effective in the CIP-GMR element from a viewpoint of increasing the MR ratio. The region of the dead layer is reduced if the stacked structure can utilize magnetization. Thus, the stacked structure can also be applied for the usage other than the magnetoresistive effect element (techniques using the spin Hall effect or the inverse spin Hall effect and using a spin transfer torque).

What is claimed is:

1. A magnetoresistive effect element comprising:
a first ferromagnetic layer;
a second ferromagnetic layer; and
a nonmagnetic spacer layer that is disposed between the first ferromagnetic layer and the second ferromagnetic layer,
wherein the nonmagnetic spacer layer includes:
a nonmagnetic metal layer, and
at least one of a first intermediate layer provided under the nonmagnetic metal layer and a second intermediate layer provided over the nonmagnetic metal layer, the at least one of the first intermediate layer and the second intermediate layer being in contact with the nonmagnetic metal layer, and the first intermediate layer and the second intermediate layer include an NiAlX alloy that is expressed by General Formula (1):

$$Ni_{\gamma1}Al_{\gamma2}X_{\gamma3} \quad (1)$$

where
X indicates one element selected from the group consisting of Si, Sc, Ti, Cr, Mn, Fe, Co, Cu, Zr, Nb, and Ta, and $0<\gamma<0.5$ in a case of $\gamma=\gamma3/(\gamma1+\gamma2+\gamma3)$.

2. The magnetoresistive effect element according to claim 1, wherein the ferromagnetic layer includes a Heusler alloy represented by Formula (2):

$$Co_2L_\alpha M_\beta \quad (2)$$

where when L indicates one or more elements selected from the group consisting of Mn and Fe, M indicates one or more elements selected from the group consisting of Si, Al, Ga, and Ge, and α and β are set to have positive values.

3. The magnetoresistive effect element according to claim 2, wherein, in the Heusler alloy represented by Formula (2), α and β satisfy the following relational expressions (2-1) and (2-2):

$$0.7<\alpha<1.6 \quad (2\text{-}1)$$

$$2<\alpha+\beta<2.6 \quad (2\text{-}3).$$

4. The magnetoresistive effect element according to claim 2, wherein, in the Heusler alloy represented by Formula (2), α and β satisfy the following relational expressions (2-1), (2-2), and (2-3):

$$0.7<\alpha<1.6 \quad (2\text{-}1)$$

$$0.65<\beta<1.35 \quad (2\text{-}2)$$

$$2<\alpha+\beta<2.6 \quad (2\text{-}3).$$

5. The magnetoresistive effect element according to claim 1, wherein the nonmagnetic metal layer includes one or more elements selected from the group consisting of Ag, Cr, Al, Au, and NiAl.

6. The magnetoresistive effect element according to claim 1, wherein X in the NiAlX alloy is one or more elements selected from the group consisting of Si, Cr, Fe, Co, and Zr.

7. The magnetoresistive effect element according to claim 1, wherein, in Formula (1), an expression of $0<\gamma<0.3$ is satisfied.

8. The magnetoresistive effect element according to claim 1, wherein, when a thickness of the NiAlX alloy is set as t1, an expression of $0.2\ nm \leq t1 \leq 10\ nm$ is satisfied.

9. A magnetic head comprising the magnetoresistive effect element according to claim 1.

10. A sensor comprising the magnetoresistive effect element according to claim 1.

11. A high frequency filter comprising the magnetoresistive effect element according to claim 1.

12. An oscillator comprising the magnetoresistive effect element according to claim 1.

13. A magnetoresistive effect element comprising:
a first ferromagnetic layer;
a second ferromagnetic layer; and
a nonmagnetic spacer layer that is disposed between the first ferromagnetic layer and the second ferromagnetic layer, wherein the nonmagnetic spacer layer includes:
a nonmagnetic metal layer, and
at least one of a first intermediate layer provided under the nonmagnetic metal layer and a second intermediate layer provided over the nonmagnetic metal layer,
the first intermediate layer and the second intermediate layer include an NiAlX alloy that is expressed by General Formula (1):

$$Ni_{\gamma 1}Al_{\gamma 2}X_{\gamma 3} \quad (1)$$

where X indicates one element selected from the group consisting of Si, Sc, Ti, Cr, Mn, Fe, Co, Cu, Zr, Nb, and Ta, and $0<\gamma<0.5$ in a case of $\gamma=\gamma 3/(\gamma 1+\gamma 2+\gamma 3)$, and a value of γ3 changes along an in-plane direction or a thickness direction thereof.

14. The magnetoresistive effect element according to claim 13, wherein the ferromagnetic layer includes a Heusler alloy represented by Formula (2):

$$Co_2L_\alpha M_\beta \quad (2)$$

where when L indicates one or more elements selected from the group consisting of Mn and Fe, M indicates one or more elements selected from the group consisting of Si, Al, Ga, and Ge, and α and β are set to have positive values.

15. The magnetoresistive effect element according to claim 14, wherein, in the Heusler alloy represented by Formula (2), α and β satisfy the following relational expressions (2-1) and (2-2):

$$0.7<\alpha<1.6 \quad (2\text{-}1)$$

$$2<\alpha+\beta<2.6 \quad (2\text{-}3).$$

16. The magnetoresistive effect element according to claim 14, wherein, in the Heusler alloy represented by Formula (2), α and β satisfy the following relational expressions (2-1), (2-2), and (2-3):

$$0.7<\alpha<1.6 \quad (2\text{-}1)$$

$$0.65<\beta<1.35 \quad (2\text{-}2)$$

$$2<\alpha+\beta<2.6 \quad (2\text{-}3).$$

17. The magnetoresistive effect element according to claim 13, wherein the nonmagnetic metal layer includes one or more elements selected from the group consisting of Ag, Cr, Al, Au, and NiAl.

18. The magnetoresistive effect element according to claim 13, wherein X in the NiAlX alloy is one or more elements selected from the group consisting of Si, Cr, Fe, Co, and Zr.

19. The magnetoresistive effect element according to claim 13, wherein, in Formula (1), an expression of $0<\gamma<0.3$ is satisfied.

20. The magnetoresistive effect element according to claim 13, wherein, when a thickness of the NiAlX alloy is set as t1, an expression of $0.2\ nm \leq t1 \leq 10\ nm$ is satisfied.

21. A magnetic head comprising the magnetoresistive effect element according to claim 13.

22. A sensor comprising the magnetoresistive effect element according to claim 13.

23. A high frequency filter comprising the magnetoresistive effect element according to claim 13.

24. An oscillator comprising the magnetoresistive effect element according to claim 13.

25. A magnetoresistive effect element comprising:
a first ferromagnetic layer;
a second ferromagnetic layer; and
a nonmagnetic spacer layer that is disposed between the first ferromagnetic layer and the second ferromagnetic layer,
wherein the nonmagnetic spacer layer includes:
a nonmagnetic metal layer, and
at least one of a first intermediate layer provided under the nonmagnetic metal layer and a second intermediate layer provided over the nonmagnetic metal layer,
the first intermediate layer and the second intermediate layer include an NiAlX alloy that is expressed by General Formula (1):

$$Ni_{\gamma 1}Al_{\gamma 2}X_{\gamma 3} \quad (1)$$

where X indicates one element selected from the group consisting of Si, Sc, Ti, Cr, Mn, Fe, Co, Cu, Zr, Nb, and Ta, and $0<\gamma<0.5$ in a case of $\gamma=\gamma 3/(\gamma 1+\gamma 2+\gamma 3)$, and a value of γ3 decreases as becoming farther from the ferromagnetic layer in a thickness direction thereof.

26. The magnetoresistive effect element according to claim 25, wherein the ferromagnetic layer includes a Heusler alloy represented by Formula (2):

$$Co_2L_\alpha M_\beta \quad (2)$$

where when L indicates one or more elements selected from the group consisting of Mn and Fe, M indicates one or more elements selected from the group consisting of Si, Al, Ga, and Ge, and α and β are set to have positive values.

27. The magnetoresistive effect element according to claim 26, wherein, in the Heusler alloy represented by Formula (2), α and β satisfy the following relational expressions (2-1) and (2-2):

$$0.7<\alpha<1.6 \quad (2\text{-}1)$$

$$2<\alpha+\beta<2.6 \quad (2\text{-}3).$$

28. The magnetoresistive effect element according to claim 26, wherein, in the Heusler alloy represented by Formula (2), α and β satisfy the following relational expressions (2-1), (2-2), and (2-3):

$$0.7<\alpha<1.6 \quad (2\text{-}1)$$

$$0.65<\beta<1.35 \quad (2\text{-}2)$$

$$2<\alpha+\beta<2.6 \quad (2\text{-}3).$$

29. The magnetoresistive effect element according to claim 25, wherein the nonmagnetic metal layer includes one or more elements selected from the group consisting of Ag, Cr, Al, Au, and NiAl.

30. The magnetoresistive effect element according to claim 25, wherein X in the NiAlX alloy is one or more elements selected from the group consisting of Si, Cr, Fe, Co, and Zr.

31. The magnetoresistive effect element according to claim 25, wherein, in Formula (1), an expression of $0<\gamma<0.3$ is satisfied.

32. The magnetoresistive effect element according to claim 25, wherein, when a thickness of the NiAlX alloy is set as t1, an expression of $0.2\ nm \leq t1 \leq 10\ nm$ is satisfied.

33. A magnetic head comprising the magnetoresistive effect element according to claim 25.

34. A sensor comprising the magnetoresistive effect element according to claim 25.

35. A high frequency filter comprising the magnetoresistive effect element according to claim 25.

36. An oscillator comprising the magnetoresistive effect element according to claim 25.

37. A magnetoresistive effect element comprising:
a first ferromagnetic layer;
a second ferromagnetic layer; and
a nonmagnetic spacer layer that is disposed between the first ferromagnetic layer and the second ferromagnetic layer,
wherein the nonmagnetic spacer layer includes:
a nonmagnetic metal layer, and
an intermediate layer provided under the nonmagnetic metal layer, the intermediate layer being in contact with the nonmagnetic metal layer, and
the intermediate layer includes an NiAlX alloy that is expressed by General Formula (1):

$$Ni_{\gamma 1}Al_{\gamma 2}X_{\gamma 3} \qquad (1)$$

where X indicates one element selected from the group consisting of Si, Sc, Ti, Cr, Mn, Fe, Co, Cu, Zr, Nb, and Ta, and $0<\gamma<0.5$ in a case of $\gamma=\gamma 3/(\gamma 1+\gamma 2+\gamma 3)$.

38. A magnetoresistive effect element comprising:
a first ferromagnetic layer;
a second ferromagnetic layer; and
a nonmagnetic spacer layer that is disposed between the first ferromagnetic layer and the second ferromagnetic layer,
wherein the nonmagnetic spacer layer includes:
a nonmagnetic metal layer, and
an intermediate layer provided over the nonmagnetic metal layer, the intermediate layer being in contact with the nonmagnetic metal layer, and
the intermediate layer includes an NiAlX alloy that is expressed by General Formula (1):

$$Ni_{\gamma 1}Al_{\gamma 2}X_{\gamma 3} \qquad (1)$$

where X indicates one element selected from the group consisting of Si, Sc, Ti, Cr, Mn, Fe, Co, Cu, Zr, Nb, and Ta, and $0<\gamma<0.5$ in a case of $\gamma=\gamma 3/(\gamma 1+\gamma 2+\gamma 3)$.

* * * * *